United States Patent [19]

Akiyama et al.

[11] Patent Number: 4,833,681
[45] Date of Patent: May 23, 1989

[54] SEMICONDUCTOR LASER WAVELENGTH STABILIZER

[75] Inventors: Koji Akiyama; Akira Ohte; Hideto Iwaoka, all of Tokyo, Japan

[73] Assignee: Yokogawa Electric Corporation, Tokyo, Japan

[21] Appl. No.: 937,359

[22] Filed: Dec. 3, 1986

[30] Foreign Application Priority Data

| Dec. 26, 1985 | [JP] | Japan | 61-294342 |
| Jan. 24, 1986 | [JP] | Japan | 61-11894 |
| Jun. 24, 1986 | [JP] | Japan | 61-96170[U] |
| Jun. 26, 1986 | [JP] | Japan | 61-98194[U] |
| Jun. 27, 1986 | [JP] | Japan | 61-149777 |
| Jun. 27, 1986 | [JP] | Japan | 61-97611[U] |
| Aug. 26, 1986 | [JP] | Japan | 61-199364 |
| Sep. 19, 1986 | [JP] | Japan | 61-221668 |

[51] Int. Cl.$^4$ .............................................. H01S 3/13
[52] U.S. Cl. ........................................ 372/32; 372/26; 372/29; 372/37
[58] Field of Search ................... 372/32, 26, 29, 37

[56] References Cited

U.S. PATENT DOCUMENTS

| 3,560,871 | 2/1971 | Chen | 372/37 |
| 3,593,189 | 7/1971 | Buhrer | 372/32 |
| 3,609,583 | 9/1971 | Brun | 372/32 |
| 3,742,382 | 6/1973 | Smith | 372/32 |
| 3,921,099 | 11/1975 | Abrams et al. | 372/32 |
| 4,486,885 | 12/1984 | Genack | 372/26 |

FOREIGN PATENT DOCUMENTS

0213186 9/1987 Japan .................................. 372/31

OTHER PUBLICATIONS

White; "Frequency Stabilization of Gas Lasers"; IEEE Journal of Quantum Electronics, vol. QE-1, No. 8; 11/1965; pp. 349–357.
Ohtsu et al; "Linewidth Reduction ... Electrical Feedback"; IEEE Journal of Quantum Electronics, vol. QE-21, No. 12; 12/1985; pp. 1905–1911.

Primary Examiner—William L. Sikes
Assistant Examiner—Xuan Thi Vo
Attorney, Agent, or Firm—Moonray Kogima

[57] ABSTRACT

Light relative to non-modulated output light emitted from a semiconductor laser is applied to an absorption cell. Frequency modulating signals are converted into amplitude modulation signals of the output light through a modulating means by utilizing absorptive properties of the absorption cell. Transmissive light outputs of the absorption cell are synchronously rectified by a lock in amplifier, and an electric current supplied to the semiconductor laser is controlled so that the output signals of the lock in amplifier are arranged to be a predetermined value. The wavelength of the output light is locked to the absorption line of the standard substance in the absorption cell. Advantageously, the invention stabilizes the instantaneous value of the oscillation frequency.

17 Claims, 20 Drawing Sheets

FIG. 35

| Substrate \ Components | Semiconductor | | Ferrodielectric Substance | Insulator |
|---|---|---|---|---|
| | GaAs(InP) | Si | LiNbO₃ / LiTaO₃ | SiO₂ (Glass Crystal) |
| Laser | Monolithic | External Fitting, Hybrid | External Fitting, Hybrid | External Fitting, Hybrid |
| Light Receiving Element | Monolithic | Monolithic | External Fitting, Hybrid | External Fitting, Hybrid |
| AOM | SAW | Transducer | SAW | Transducer |
| Absorption Cell | Hole→Glass Coat Sealing→Cover | Hole→Thermal Oxidation Sealing→Cover | Hole→Glass Coat Sealing→Cover | Hole→Sealing→Cover (Evanescent Effect is Permissible) |
| Fabry-Perot Adjusting Method for Broad Band Region Feedback Configuration (Hole / Ridge / Dope) | Temperature or Electric Current | Temperature or Electric Current | Temperature or Electric Field | Temperature |
| Thermal Control (Laser F-P) | Thin Film Resistance or the Like | Thin Film Resistance or the Like | Thin Film Resistance or the Like | Thin Film Resistance or the Like |
| Circuit | Hybrid | Identical Substrate Monolithic | Hybrid | Hybrid |

SEMICONDUCTOR LASER WAVELENGTH STABILIZER

BACKGROUND OF THE INVENTION

1. Field of Invention

This invention relates to a semiconductor laser wavelength stabilizer for stabilizing the wavelength of a semiconductor laser by causing same to accord with the absorption line of atoms and molecules, and more particularly, to improvements in such stabilizers.

2. Description of the Prior Art

FIG. 1 is a block diagram of a conventional semiconductor laser wavelength stabilizer, wherein modulation signals, having a frequency fm, are overlapped with an electric current supplied to a semiconductor laser LD, thereby to modulate the oscillation wavelength of the laser output. One flux of light split by means of a beam splitter BS is applied to an absorption cell CL, wherein is enclosed a standard substance which causes absorption at a given wavelength. Another flux of light split by the beam splitter BS is reflected by mirror M and then becomes the output light. The light emerging from the absorption cell CL is detected and converted by photodetector PD into electric signals. The thus converted signals are then synchronously rectified at a frequency fm by means of lock in amplifier LA. It is feasible to lock the wavelength of the semiconductor laser to the absorption line of the atoms which are present in the absorption cell CL by controlling the electric current supplied to the semiconductor laser LD so that the output signals from lock in amplifier LA come to a specified value by a control means CT.

In the conventional semiconductor wavelength stabilizer, the frequency of the output light of the semiconductor laser is locked by the absorption line of the standard substance, thereby causing the mean frequency to have stability. However, in frequency invariably undergoes fluctuations at the modulation frequency fm. This leads to instability of the instantaneous value of the oscillating frequency.

SUMMARY OF THE INVENTION

Accordingly, an object of the invention is to overcome the aforementioned and other deficiencies and disadvantages of the prior art.

Another object is to provide a semiconductor laser wavelength stabilizer wherein light relative to non-modulation output light emitted from a semiconductor laser is supplied to an absorption cell; frequency modulation signals are converted into amplitude modulation signals of output light through modulation means by utilizing the absorptive properties of the absorption cell; an output of transmissive light from the absorption cell is synchronously rectified by means of a lock in amplifier; an electric current supplied to the semiconductor laser is controlled so that the output signal from the lock in amplifier has a given value; and the wave length of the output light is locked to the absorption line of the standard substance in the absorption thereby to stabilize the instantaneous value of the oscillating frequency.

BRIEF DESCRIPTION OF THE DRAWING

FIG. 35 is a table depicting a method of fabricating individual components of the embodiment of FIG. 34.

DETAILED DESCRIPTION OF PREFERRED EMBODIMENTS

Figure 1:
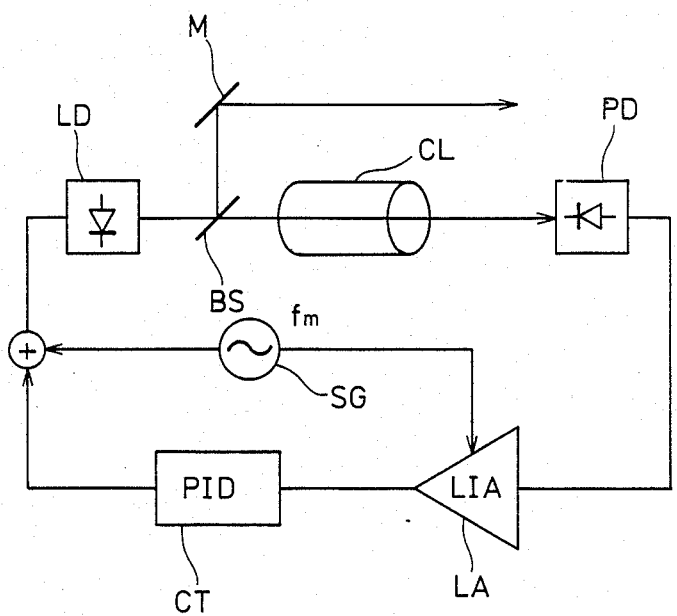
FIG. 1 is a block diagram depicting a conventional semi-conductor laser wavelength stabilizer.
Figure 2:
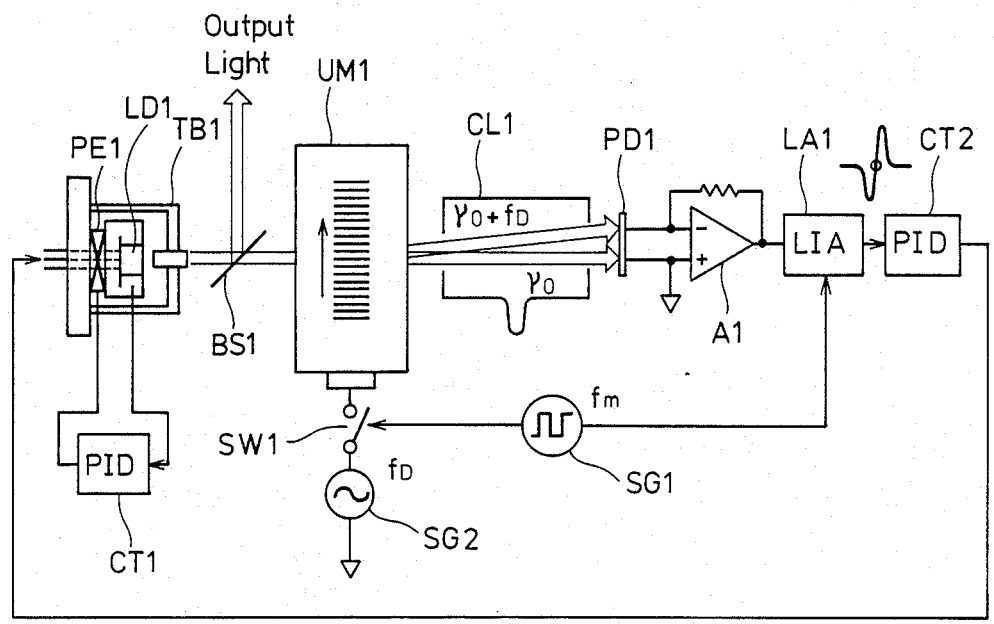
FIG. 2 is a block diagram depicting a first illustrative embodiment of the invention.

FIG. 2 illustrates a first embodiment of the invention comprising a semiconductor laser LD1, a Peltier element PE1 for cooling off or heating semiconductor laser LD1, a temperature control measns CT1 for controlling the temperature of semiconductor laser LD1 to a fixed value by driving the Peltier element, a constant temperature oven TB1 for decreasing fluctuations in temperature by housing semiconductor laser LD1 and the Peltier element PE1, a beam splitter BS1 for bidirectionally splitting output light emitted from semiconductor laser LD1, acousto-optic deflector UM1 (often referred to as "AOD") upon which one flux of light emerging from beam splitter BS1 strikes (this acoustooptic deflector may be considered to constitute a modulation means), an absorption cell CL1 which undergoes incidence of diffraction light output of deflector UM1 (this absorption cell CL1 encloses a standard substance, such as Cs, which absorbs the light at a specified wavelength), an optical detector PD1 upon which the transmissive light of the absorption cell CL1 is rendered incident, an amplifier A1 for inputting output electric signals from photodetector PD1, a lock in amplifier LA1 for inputting electric outputs from amplifier A1, a PID controller CT2 which constitutes an electric current control circuit both for inputting the outputs from said lock in amplifier LA1 and for controlling the electric current supplied to semiconductor laser LD1, a switch SW1 having one end thereof which is connected to acousto-optic deflector UM1, a signal generator SG1 for supplying outputs by which switch SW1 is turned ON and OFF at frequency fm (e.g. 2 kHz), and a second signal generator SG2 to which the other end of switch SW1 is connected. This second signal generator SG2 has frequency $f_D$ (e.g. 80 MHz).

The operation of the FIG. 2 embodiment is as follows. The temperature of semiconductor LD1 is controlled to a fixed value through action of Peltier element PE1 by means of control circuit CT1 for inputting temperature detecting signals within constant temperature oven TB1. The output light of semiconductor laser LD1 is bidirectionally split by beam splitter BS1. The reflected light becomes the output light toward the outside, and the transmissive light is rendered incident upon acousto-optic deflector UM1. Since acoustooptic deflector UM1 is driven by the outputs with frequency $f_D$ which are supplied by signal generator SG2 when switch SW1 is ON, the majority of the incident light with frequency $\nu_o$ is diffracted and is then subjected to frequency (Doppler) shift. The light with frequency $\nu_o + f_D$ which is defined as the primary diffraction light falls upon absorption cell CL1. When switch SW1 is in an OFF state, the incident light with frequency $\nu_o$, which is all defined as zero dimensional diffraction light, strikes upon absorption cell CL1. Switch SW1 is driven by a clock with frequency fm which is included in signal generator SG1 and hence the light falling upon abosrption cell CL1 undergoes frequency modulation in which the modulation frequency is fm, and the modulation depth is $f_D$.

Figure 3:
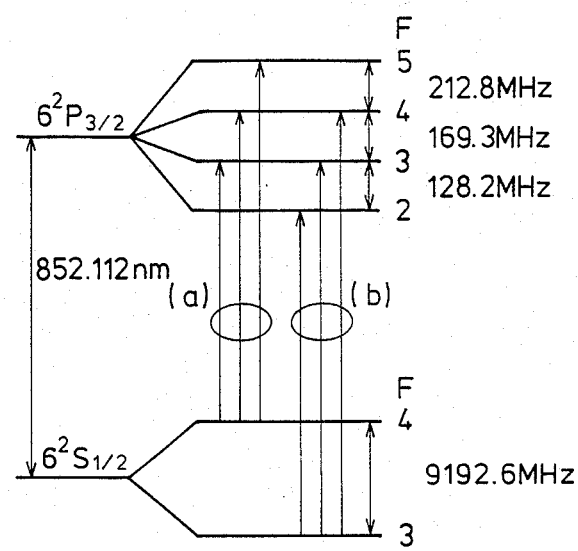
FIG. 3 is an energy level chart depicting an infinitesimal structure of an energy level of a Cs atom.

FIG. 3 is an energy diagram showing energy levels of the Cs atoms. Illustratively, the Cs is used in the absorption cell CL1. If light with a wavelength of 852.112 nm impinges upon the Cs atoms, carriers are excited from $6^2S_{\frac{1}{2}}$ to $6^2P_{3/2}$, and the light loses its energy, whereby absorption takes place. In this case, the levels of $6^2S_{\frac{1}{2}}$ and $6^2P_{3/2}$ are possessed of two or four pieces of infinitesimal structures, respectively. Strictly speaking, the absorption therefore occurs with respect to the light having six types of wavelengths (or frequencies) between these levels. In fact, however, since an absorption spectrum width bears several hundred MHz because of the Doppler expansion, no infinitesimal structure having the level of $6^2P_{3/2}$ can usually be observed. Consequently, as illustrated in FIG. 4, it is observed that two kinds of absorptions are present on the absorption spectrum line (a) absorption of the absorption signals shown in FIG. 4 involving the one sent from F4 (of FIG. 3), and (b) absorption of the absorption signals shown in FIG. 4 involving the one sent from F3 (of FIG. 3).

Figure 4:
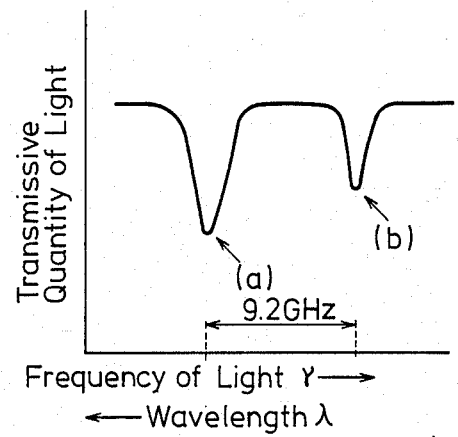
FIG. 4 is a graph depicting absorption caused by the Cs atoms.
Figure 5:
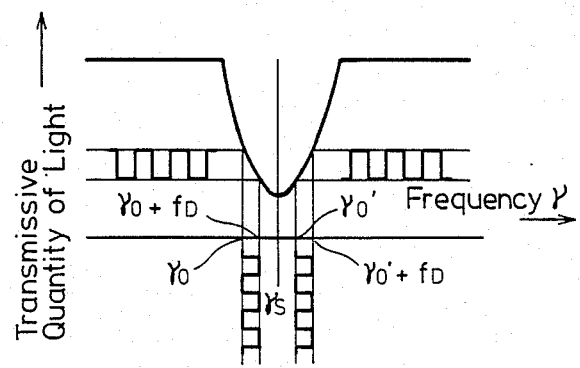
FIG. 5 is an explanatory view showing operation of the embodiment of FIG. 2.
Figure 6:
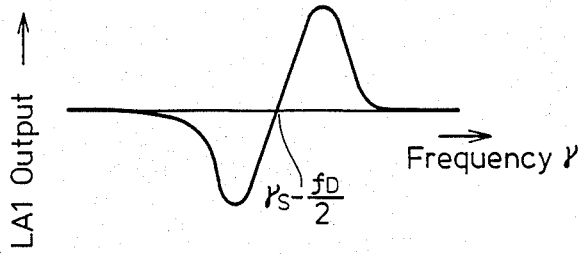
FIG. 6 is a second characteristic curve diagram depicting the operation of the embodiment of FIG. 2.

When the light modulated by acousto-optic deflector UM1 falls upon absorption cell CL1, as depicted in FIG. 5, the signal appears in the output by the transmissive ligth volume being modulated at the position alone (e.g. point (a) of FIG. 4) of the absorption signals. Provided that this signal is converted into an electrical signal by photodetetor PD1 and the thus converted signal is then synchronously rectified at frequency fm in lock in amplifier LA1 with the aid of amplifier A1, there is obtained a primary differential waveform as depicted in FIG. 6. If the outputs of lock in amplifier LA1 are locked (controlled, that is) to the center of the primary differential waveform, the output light of the semiconductor laser LD1 will bear a stable frequency of $\nu_s - f_D/2$ wherein $\nu_s$ is the frequency of the transmitted light and $f_D$ is the frequency of the modulation of source SG2.

In this embodiment, since the oscillating frequency of the laser is not modulated, the light source is characerized by high stability for instantaneousness, that is high stability of the instantaneous value of the oscillating frequency.

Even if diffraction efficiency of deflector UM1 is varied an optical component (i.e. zero dimensional diffraction light) which does not contribute to the modulation increases in volume, whereas the signal intensity merely decreases, and no influence is exerted on the central wavelength.

The modulation frequency fm is used as the reference frequency of lock in amplifier LA1 in FIG. 2. However, frequencies of odd numbered multiples may also be used.

The standard substance which is used in cell CL1 may be, for example, Cs, Rb, $NH_3$, $H_2O$, and the like, with Cs being preferred.

In the FIG. 2 embodiment, the deflector UM1 is used as the modulation means. However, the invention is not confined to such use of deflector UM1. For example, a phase modulator which makes use of an electro-optical element may be used. This involves, for example, a longitudinal type modulator, a lateral type modulator and a travelling wave type modulator (see Amnon Yarif, Fundamentals of Optical Electronics, published by Maruzen Books, Pages 247–253.)

In the FIG. 2 embodiment, the electric current supplied to semiconductor laser LD1 is controlled by the output signals from the control means. This is not, however, to be considered to be limiting of the invention. The temperature of the semiconductor laser may also be controlled.

Figure 7:
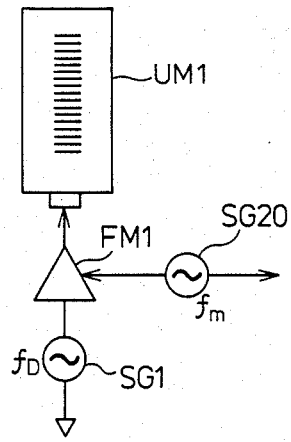
FIG. 7 is a block diagram depicting principal portions of a second illustrative embodiment of the invention.

FIG. 7 depicts the principal portions of a second embodiment which differs from the embodiment of FIG. 2 in that an FM modulator FM1 is controlled by a sine wave generator SG20 (e.g. modulation frequency is 2 kHz) whereby acousto - optic deflector UM1 is modulated by sine waves. On the other hand, in FIG. 2, a square wave generator SG1 is applied through switch SW1.

Figure 8:
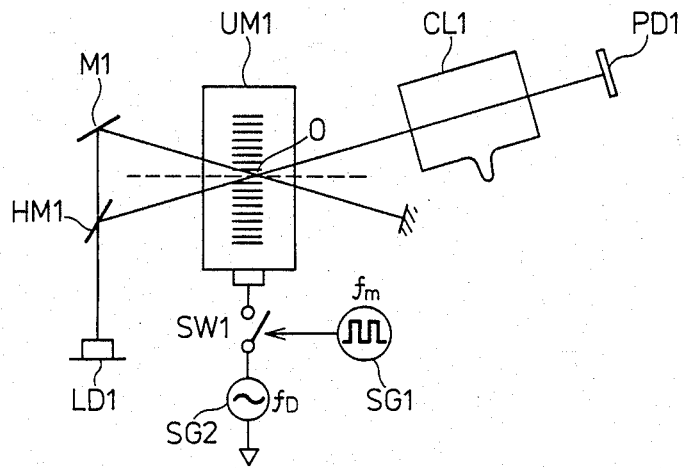
FIG. 8 is a block diagram depicting principal portions of a third illustrative embodiment of the invention.

FIG. 8 depicts principal portions of an optical system of the third illustrative embodiment which differs from the embodiment of FIG.2 in the following manner. A half mirror HM1 bidirectionally splits the output light of laser LD1 and causes the reflected light to strike from one direction upon deflector UM1. A mirror M1 reflects the light which penetrates the half mirror HM1 and causes the thus reflected light to fall from the other direction upon acousto-optic deflector UM1. When switch SW1 is in the OFF state, the light which relfects on half mirror HM1 is transmitted through deflector UM1 and then strikes upon cell CL1 at the frequency $\nu_o$. When swtich SW1 is ON, the light which is reflected on mirror M1 is diffracted by deflector UM1 and then impinges on cell CL1 at frequency $\nu_o + f_D$.

Thus, advantageously, in the third embodiment, the light path is unmovable within cell CL1. It should be noted that when an electro-optical element is used as the modulating means in the phase modulator, the direction of the output light is not changeable.

Figure 9:
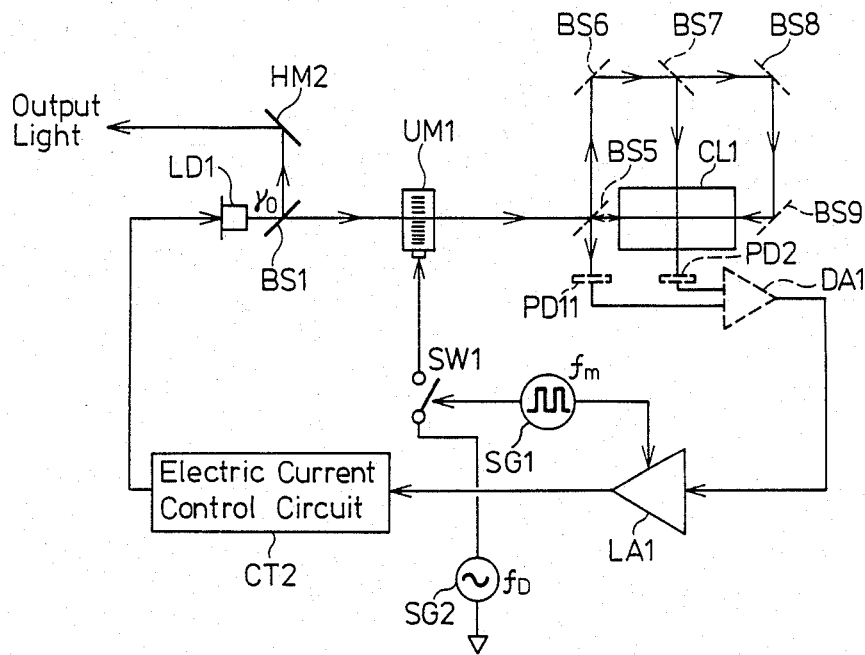
FIG. 9 is a block diagram depicting a fourth illustrative embodiment of the invention.

In FIG. 9, one part of the fluxes of emergent light from deflector UM1 serves as a pump light and is made to impinge upon absorption cell CL1. Another part of the narrow fluxes of the emergent light serves as a probe light and is made to strike from the opposite direction upon the absorption cell CL1, thereby producing saturated absorption signals. By virtue of this saturated absorption spectroscopy (Reference, see T. Yabuzaki, A. Hori, M. Kitano and T. Ogawa, "Frequency Stabilization of Diode Lasers Using Doppler-Free Atomic Spectra", Proc. Int. Conf. Lasers 83), the Doppler expansion disappears. Hence, it is feasible to distinguish the infinitesimal structure which was previously explained with reference to FIG. 3.

Figure 10:
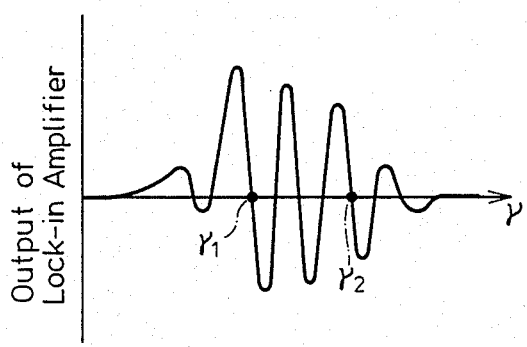
FIG. 10 is a graph depicting output signals from the lock in amplifier of the embodiment of FIG. 9.

Since output signals of lock-in amplifier LA1, which are based on the infinitesimal structure shown in FIG. 10, can be obtained, it is possible to realize a still more stable semiconductor laser wavelength stabilizer by locking to any one (e.g. $\nu_1$ of FIG. 10) of the signals.

The embodiment of FIG. 9 differs from that of FIG. 2 in the portion indicated by a dotted line; namely, the provision of beam splitters BS5 to BS9, light receiving elements PD11, PD2 and a differential amplifier DA1. The outputs of the differential amplifier DA1 are introduced into lock in amplifier LA1. In such a case, it is favorable to adopt the structure shown in FIG. 8 in order that the direction of the output light of deflector UM1 does not vary.

Figure 11:
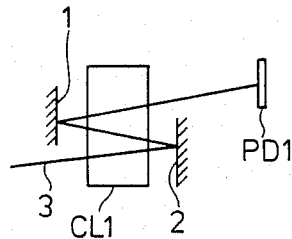
FIG. 11 is a block diagram depicting the principal portions of a fifth illustrative embodiment of the invention.

In FIG. 11, principal portions of the fifth illustrative embodiment are depicted, wherein the device illustrated in FIG. 2 is partially varied in configuration. In FIG. 11, there is shown only a circumferential portion of the absorption cell, and reflection members 1,2 and light path 3 for the output light of deflector UM1 which light subsumes the zero dimensional diffraction light and the primary diffraction light. The output light of deflector UM1 passes through absorption cell CL1 and is then reflected on reflection member 2. The thus reflected light penetrates absorption cell CL1 once again and is similarly reflected on reflection member 1. After passing through absorption cell CL1, the output light falls upon photo-detector PD1. That is, since the light penetrates absorption cell CL1 three times, even if the length of absorption cell CL1 is reduced by a factor of 3, the volume of absorption becomes the same.

Figure 12:
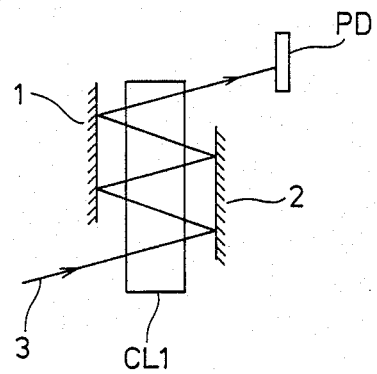
FIG. 12 is a block diagram depicting principal portions of a sixth illustrative embodiment of the invention.

FIG. 12 depicts principal portion of a sixth illustrative embodiment, wherein the widths of absorption cell CL1 and reflection members 1,2 are broadened so as to cause the reflections of the light to be a plurality of times. The output light emitted from the deflector UM1 is reflected on reflection members 1,2 respectively and falls upon detector PD. The output light passes through cell CL1 five times . Thus, compared to FIG. 11, it is feasible to proportionally reduce the length of absorption cell CL1. It is possible to arbitrarily set the number of penetrations through absorption cell CL1 by adjusting the widths both of cell CL1 and of members 1,2, and also adjusting the angle at which the output light strikes upon cell CL1.

Figure 13:
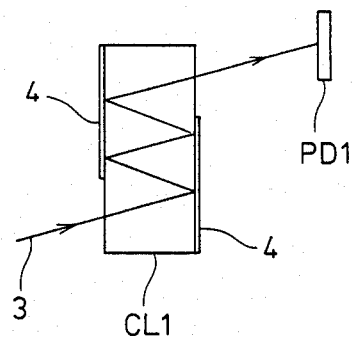
FIG. 13 is a block diagram depicting principal portions of a seventh illustrative embodiment of the invention.

FIG. 13 depicts principal portions of a seventh illustrative embodiment, wherein reflection members 1,2 are not individually separately provided as in FIGS. 11 and 12. Instead, a metallic thin film 4 is formed onthe absorption cell CL1 by vapor deposition or similar methods and serves as the reflection member. With this arrangement, it is possible to further reduce the size of the device.

In the embodiments described in FIGS. 11, 12, 13, where the size of the cell is similar to that of the conventional absorption cell, advantageously, in the invention, the length of the light path is made to be longer than is the case for the conventional absorption cell. Thus, with the invention, advantageously, the amount of absorption increases and the stability of the wavelength of the output light is improved.

Figure 14:
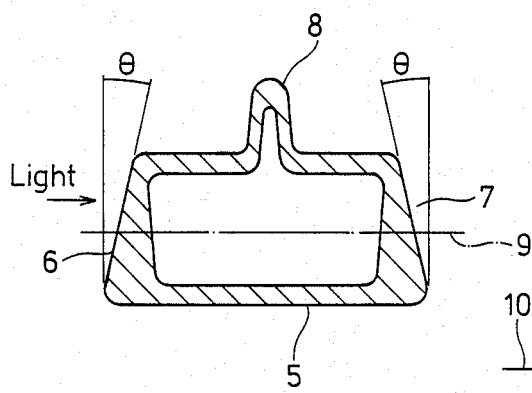
FIG. 14 is a sectional view depicting principal portions of an eighth illustrative embodiment of the invention.

FIG. 14 depicts an eighth embodiment wherein the sectional view was obtained by a plane cut through the central axis of the absorption cell CL1 in FIG. 2. The eighth illustrative embodiment comprises a vessel 5 of of cell CL1 with an incidence plane of light 6 and an emergence plane of light 7; and a sealing port 8. The cell CL1 has a central axis 9. Both the incidence plane 6 and the emergence plane 7 are inclined at an angle of $\theta$ to the plane perpendicular to the central axis 9.

Figure 15:
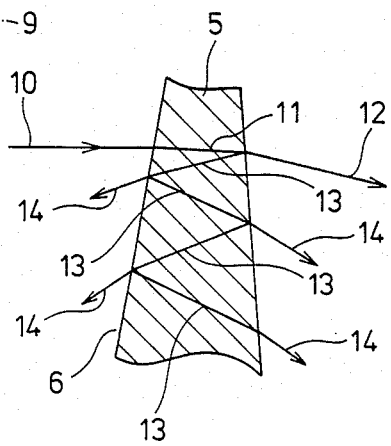
FIG. 15 is a cross-sectional view depicting operation of the embodiment of FIG. 14.

FIG. 15 depicts mutli-reflections of light on the incident plane 6, wherein a flux 10 of incident light impinges on vessel 5, another flux 11 travels within vessel 5, and a further flux 12 of transmissive light leaves vessel 5. A flux 13 of multi-reflection light is reflected a plurality of times within vessel 5 and leaks out as another flux 14 of multi-reflection light outside of vessel 5. Since incidence plane 6 is not parallel to the plane perpendicular to the central axis of vessel 5, the multi-reflection light fluxes 13,14 of the incident light flux 10 which falls in parallel to the central axis are reflected in a direction different from the incident light flux 10. For this reason, incident light flux 11 and multi-reflection light flux 13 do not interfere with each other at all. Likewise, the incident light flux 10, transmissive light flux 12 and multi-reflection light flux 14 do not interfere with each other. Thus, no noise caused by the interference, which would otherwise take place, is created and hence the intensity of the transmissive light does not fluctuate with the frequency. Accordingly, good stability is attached.

It is to be noted that the description is in connection with incidence plane 6 in this example. However, the situation is the same with the emergence plane 7. The oblique angle $\theta$ varies in accordance with the thickness of vessel 5, beam diameter of the incident light or the like. It has been found that angle $\theta$ of 2° to 3° is sufficient in the ordinary case. Vessel 5 is described as being in the form of a circular cylinder. However, vessel 5 may assume other suitable configurations having like angularity. In other words, the incident plane and emergent plane are flat, and it is merely required that they be disposed vis-a-vis with each other. The incident and emergent planes 6,7 of vessel 5 may comprise light transmissive material, and other portions may be of non-transparent material. Furthermore, the slopes of the incident and emergent planes 6,7 need not be necessarily given to both the inside and outside of vessel 5. It is sufficient that either one of them be inclined.

Figure 16:
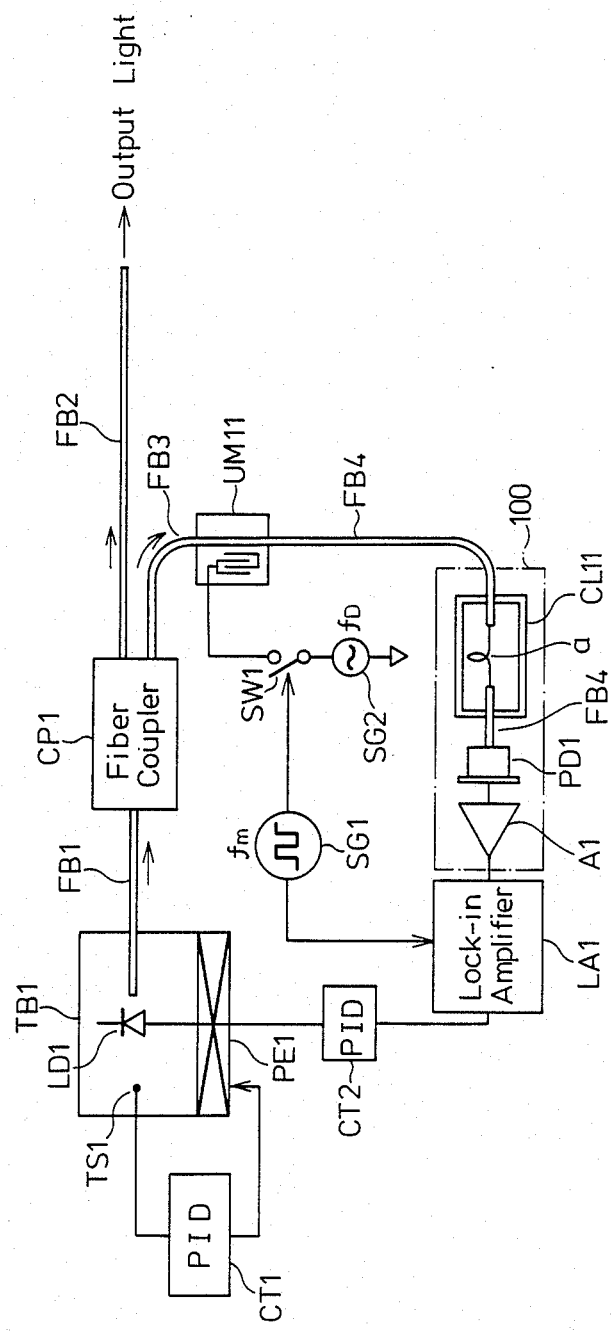
FIG. 16 is a block diagram depicting a ninth illustrative embodiment of the invention.

FIG. 16 depicts a ninth illustrative embodiment wherein evanescent absorption of light is utilized. The same components as those shown in FIG. 2 are marked with the same reference symbols and description thereof is omitted hereat for clarity. In FIG. 16, a single mode optical fiber FB1 is subjected to incidence of output light from semiconductor laser LD1, for inputting of light to a fiber coupler CP1, which is connected to another single mode optical fiber FB2 upon which one flux of output light from fiber coupler CP1 falls and still another single mode optical fiber FB3 which carries another flux of output light from fiber coupler CP1. Connected to optical fiber FB3 is a waveguide passage type acousto-optic deflector UM11 for inputting the output light from optical fiber FB3. Connected to deflector UM11 is a further single mode optical fiber FB4 for transmitting output light from acousto-optic deflector UM11 eventually to photodetector PD1 through absorption cell CL11. The optical fiber FB4 passes through absorption cell CL11. The cell CL11 is designed for enclosing a standard substance (e.g. Cs) which absorbs the light at a given wavelength. A core portion a remains exposed within cell CL11 after removing the cladding portion of optical fiber FB4.

Figure 17:
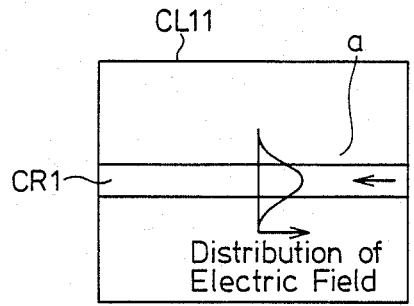
FIG. 17 is a view depicting operation of the embodiment of FIG. 16.

The operation of the FIG. 16 embodiment is as follows. The output light from laser LD1, which is controlled in terms of temperature, travels via optical fiber FB1 and is then branched off into two directions by means of coupler CP1. One flux of the thus branched output light is emitted outside through optical fiber FB2. The other flux of output light is then transmitted through optical fiber FB3 and strikes waveguide passage type acousto-optic deflector UM11. The light modulated by deflector UM11 travels through optical fiber FB4 and then penetrates absorption cell CL11. Within cell CL11, as illustrated in FIG. 17, there is generated an evancescent wave, vis., a portion in which the propagation light permeates outside the core portion a of optical fiber FB4. An electric field over this portion mutually acts on the circumferential Cs gas of the cell CL11, whereby absorption takes place at a specified wavelength. Thus, if the output of optical fiber FB4 is detected by means of photo detector PD1, absorption signals will be obtained. As in the conventional case, when feeding the absorption signal via lock in amplifier LA1 and back to laser LD1, the oscillating frequency of laser LD1 is controlled to a frequency near the center of absorption.

The embodiment of FIG. 16 yields many advantages identical to those of the FIG. 2 embodiment. In addition, the optical transmission system consists entirely of optical fibers and hence positioning operation is not required. This leads to simplicity of adjustment and enables miniaturization of the arrangement.

A single mode fiber is used as optical fiber FB4 which passes through cell CL11. However, the invention is not limited to this type of fiber. Instead a multi-mode optical fiber is equally usable.

Figure 18:
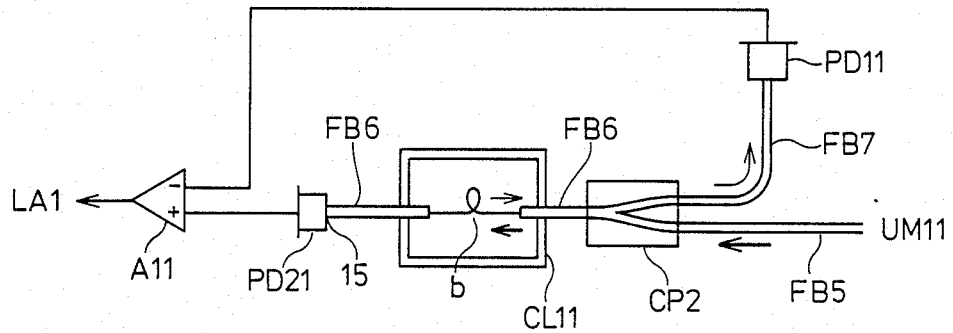
FIG. 18 is a block diagram depicting a tenth illustrative embodiment of the invention.

FIG. 18 depicts a tenth embodiment of the invention wherein the dot line box 100 depicted in FIG. 16 is changed and a saturated absorption method is utilized. Connected to deflector UM11 as a single mode optical fiber FB5 which propagates output light from deflector UM11. A fiber coupler CP2 has one end connected to optical fiber FB5, another end to optical fiber FB7, and still another end to single mode optical fiber FB6, which is connected through absorption cell CL11 to optical fiber FB6. A core portion b is left exposed within cell CL11 by removing a cladding portion of optical fiber FB6. A half mirror coated end surface 15 is provided at one end of fiber FB6 which is connected to a first photodetector PD21 for detecting light transmitted from end surface 15. A second photo detector PD11 is connected to optical fiber FB7 and detects light reflected from end surface 15 of optical fiber FB6 through fiber coupler CP2 (see arrows). A differential amplifier A11 is connected to the outputs of the first and second photo detectors PD21 and PD11, which input respective electric outputs to amplifier A11. Amplifier A11 then outputs signals to lock in amplifier LA1 as in the embodiment of FIG. 16.

In the FIG. 18 embodiment, the output light from deflector UM11 is made to fall via optical fiber FB5 upon fiber coupler CP2 and travels through optical fiber FB6. Subsequently, evanescent waves produced outside core portion b which waves, acting as pump light, saturate the light absorption of the standard substance (e.g. Cs) in the vicinity thereof. The major part (e.g. 90%) of the light travelling through fiber FB6 strikes via the end surface 15 upon detector PD21. On the other hand, the remainder (e.g. 10%) of the light is reflected on end surface 15 and travels through fiber FB6 in the reversed direction this time, and its evanescent waves, defined as a probe light overlapped with the pump light, produces absorption. This probe light is led via fiber FB7 to detector PD11 through fiber coupler CP2. Since the outputs from detectors PD21 and PD11 are subtracted by differential amplifier A11, the absorption signals by Doppler expansion are accordingly erased, thereby outputting saturated absorption signals having sharp absorption spectrums to lock in amplifier LA1. Due to a feedback loop, such as that of FIG. 16 comprising components UM11, SW1, SG1, it is feasible to control the oscillating frequency of the laser LD1, in a highly stable manner by virtue of peaks of the saturated absorption spectrums.

In the embodiment, the end surface 15 is a half coated mirror. However, the invention is not so limited. A half mirror may just as well be interposed between, for example, the optical fibers FB6.

Figure 19:
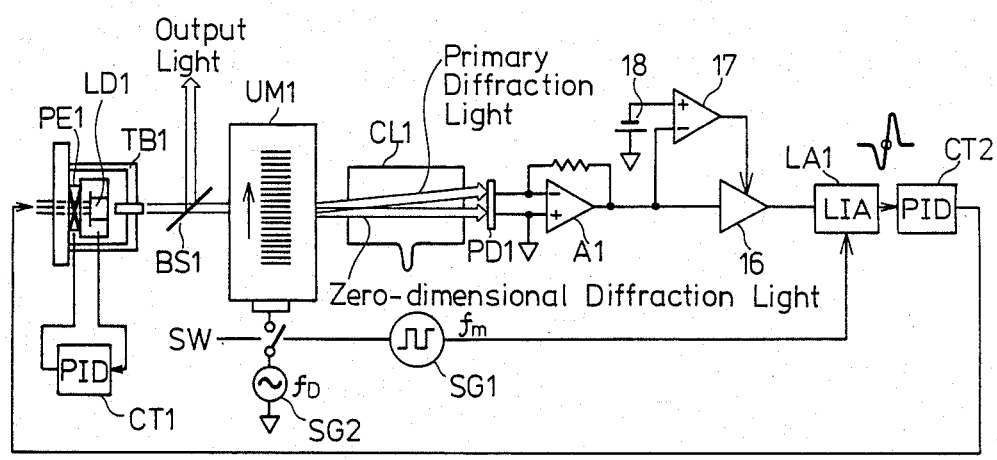
FIG. 19 is a block diagram depicting an eleventh illustrative embodiment of the invention.

FIG. 19 depicts an eleventh illustrative embodiment, and only those parts which differ from the FIG. 2 embodiment will be discussed. The stabilizer comprises a variable gain amplifier 16 which is supplied the output signals from amplifier A1 and outputs signals to lock in amplifier LA1, a comparator 17 comprising an inversion (−) input terminal which is connected to receive output signals from amplifier A1, a non-inversion (+) input terminal which is connected to a setting power source 18 which is connected to a common electric potential point and an output terminal connected to variable gain amplifier 16. The gain of amplifier 16 is controlled by output signals from comparator 17.

Figure 20:
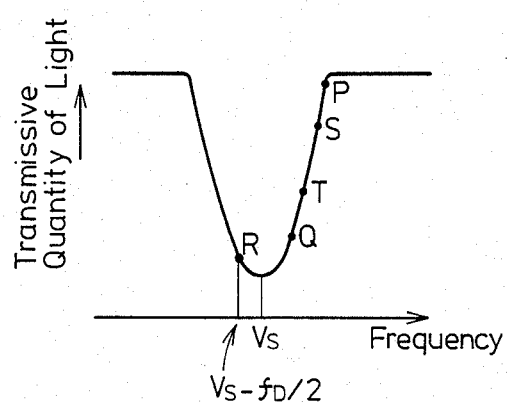
FIG. 20 is a view depicting operation of the embodiment of FIG. 19.

The resonant absorptions of absorption cell CL1 used in the FIG. 19 embodiment has the characteristics depicted in FIG. 20. Supposing that the frequency of the output light from deflector UM1 is positioned at point P, the amount of transmissive light increases. the output from amplifier A1 is largely deflected in the negative direction, the output from comparator 17 assumes a high level, and the gain of variable gain amplifier 16 diminishes. Subsequently, a moving point slowly shifts from point P towards the bottom of the resonant absorption curve, viz, in the direction of frequency $v_s$. Concurrently, the transmissive light decreases in volume, whereas the output of amplifier A1 gradually grows. At a point Q, the output from amplifier A1 becomes higher than setting power source 18, the output of comparator 17 decreases to a low level, and the gain of amplifier 16 is increased, whereby the output of laser LD1 is maintained at a point R with high stability.

Figure 21:
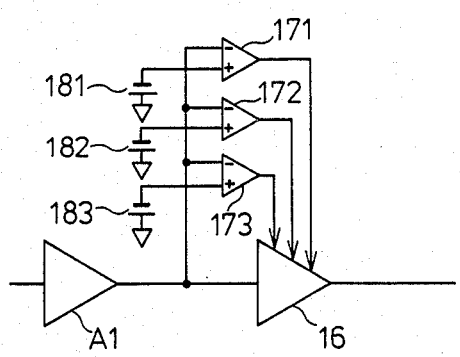
FIG. 21 is a block diagram depicting a twelfth illustrative embodiment of the invention.

FIG. 21 depicts a twelfth illustrative embodiment of the invention wherein a plurality of comparators 171,172,173 and a plurality of power sources 181,182,183 are used in place of the one comparator 17 and one power source 18 in the arrangement of FIG. 19, and wherein a mechanism is provided to change over the gain of variable gain amplifier 16. The output of amplifier A1 is connected to each of the inversion (−) input terminals of comparators 171,172, 173. The outputs of comparators 171,172,173 control the outputs from variable gain amplifier 16. Setting power sources 181,182,183 are connected to non-inversion (+) input terminals of comparators 171,172, 173, respectively. Although not shown, as in the case of FIG. 19, the outputs from photodetector PD1 are inputted to amplifier A1, and the outputs from variable gain amplifier 16 are inputted to lock in amplifier LA1. With such a configuration, comparators 171, 172, 173 individually assume low levels at points S, T, Q, of the curve depicin FIG. 20, and the gain of amplifier 16 gradually rises. With this step, it is possible to stably converge at point R at a high velocity. It is to be noted that the gain of amplifier 16 may also be consecutively controlled.

Figure 22:
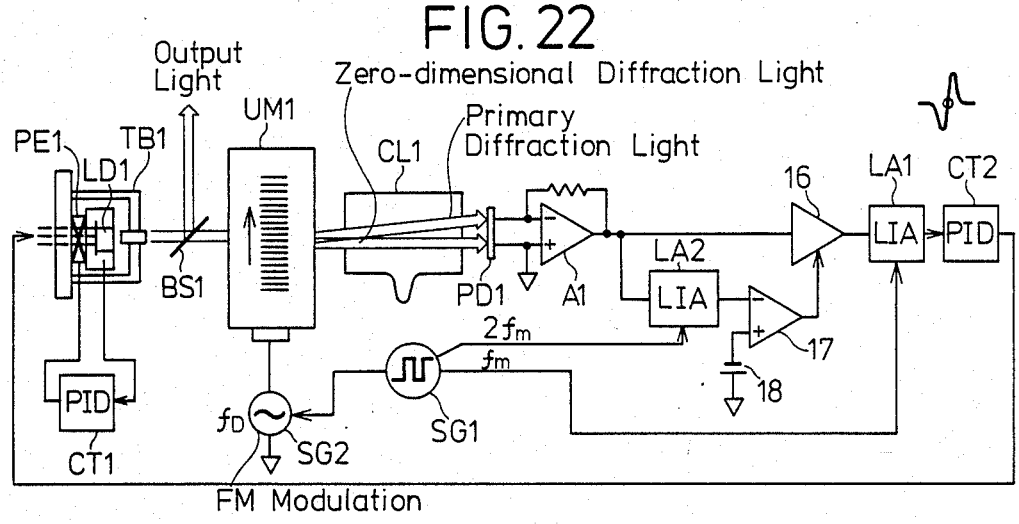
FIG. 22 is a block diagram depicting a thirteenth illustrative embodiment of the invention.

FIG. 22 depicts a thirteenth illustrative embodiment, which differs from the FIG. 19 embodiment in the following manner. Between the inverted (−) input terminal to comparator 17 is inserted a lock in amplifier LA2 which is connected to signal generator SG1 which applies 2fm signals to amplifier LA2. Signal generator SG1 frequency modulates SG2 with sine waves or chopping waves. Output signals from amplifier A1 are inputted to lock in amplifier LA2 and also to variable gain amplifier 16. Lock in amplifier LA2 is driven by means of signal generator SG1 which generates the output signals of even frequency 2fm, which is twice as high as the modulation frequency of signal generator SG2, whereby such output signals from SG1 are synchronously rectified. A secondary differential signal of amplifier A1 is thus generated by amplifier LA2 and applied to comparator 17. The outputs from lock in amplifier LA2 are inputted to the inverted (−) input terminal of comparator 17 which supplies output signals to control amplifier 16. The output from amplifier 16 is inputted to amplifier LA1. The non-inverted (+) input terminal of comparator 17 is connected to setting power source 18.

According to the embodiments of FIGS. 19, 21, 22, in case light from laser LD1 deviates from a preset value, there is little likelihood that the output light will exceed the preset value, and with the embodiments, it is feasible to keep the output light at the preset value with high stability. By virtue of this advantage, even if the light from the laser greatly deviates from the preset value, it is possible to make it converge at the preset value, and at the same time, the wavelength is made to be highly stable.

In the embodiments of FIGS. 19, 21, 22, variable gain amplifier 16 is disposed behind (i.e. in the figures to the right of) amplifier A1. It is, however, also possible to locate amplifier 16 at the rear (i.e. to the right of) of lock in amplifier LA1 and PID controller CT2. That is to say, amplifier 16 may be placed anywhere within the feedback loop.

Figure 23:
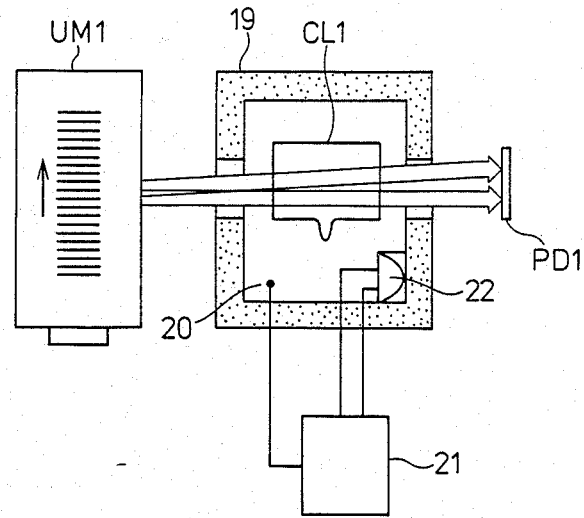
FIG. 23 is a block diagram depicting a fourteenth illustrative embodiment of the invention.

FIG. 23 depicts a fourteenth illustrative embodiment wherein the temperature of absorption cell CL1 (such as used in the FIG. 2 embodiment) is controlled to a fixed value. A constant temperature oven 19 comprises a surrounding container of an adiabatic material and has the inside thereof provided with absorption cell CL1. Oven 19 is further formed with a path for the output light from deflector UM1 to detector PD1. A temperature measuring element 20 is disposed within oven 19. The output of temperature measuring element 20 is inputted to a temperature adjuster 21. The output of temperature adjuster 21 is inputted to a heater 22. Constant temperature oven 19, temperature measuring element 20, temperature adjuster 21, and heater 22, together, may be considered as a temperature control means. The temperature within oven 19 is measured by element 20. Heater 22 is controlled by adjuster 21 so as to keep the temperature within oven 19 substantially constant. The temperature is set to such a value that the volume of absorption is large in accordance with the dimensions of cell CL1, and its secondary differential is at a maximum. When the standard substance in cell CL1 is Cs, the volume of absorption is small at a temperature of less than 20° C., and there exists the most suitable value of the secondary differential of the absorption quantity in the vicinity of 40° C.

According to the above configuration, even if the circumferential temperature varies, the temperature of the absorption cell is kept constant. Consequently, there is no variation in quantity of absorption and in amount of the secondary differential, and the stability of the wavelength of the output light is not deteriorated at all by fluctuations in circumferential temperature. Furthermore, the temperatures at which the absorption quantity of the absorption cell is increased, can be selected regardless of the circumferential temperature. Hence, it is feasible to obtain a comparatively large amount of absorption with respect to even a small absorption cell, thereby enabling miniaturization of the arrangement. In addition, the embodiment is usuable within a wide range of circumferential temperatures.

In the FIG. 23 embodiment, the heater 22 alone is used for controlling the temperature within oven 19. However, if the temperature to be controlled is close to the circumferential temperature, a cooling means may be additionally utilized. Moreover, in place of heater 22 other heating and cooling devices, for example, a Peltier element, which is capable of heating and cooling may be used.

The temperature measuring element 20 and temperature adjuster 21 may be omitted by making use of a PTC thermistor or a posistor whose resistance value increases in proportion to temperature increases, as the heater 22.

Figure 24:
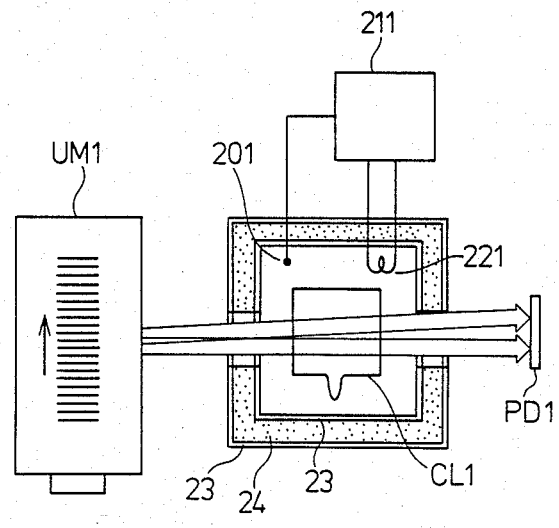
FIG. 24 is a block diagram depicting a fifteenth illustrative embodiment of the invention.

FIG. 24 depicts a fifteenth illustrative embodiment wherein the absorption cell CL1 (which may be used for example in the arrangement of FIG. 2) is not subjected to influence due to circumferential temperature or outside magnetic field. The oven (unnumbered) comprises a soft magnetic plate 23, such as of permalloy or the like, on the inside and outside of the oven surrounding adiabatic material 24. The oven surrounds the cell CL1 and provides a path for the output light from deflector UM1 to detector PD1. A temperature measuring element 201 is provided in the oven for measuring the temperature around cell CL1. The output from temperature measuring element 201 is inputted to temperature adjuster 211. A heater 221 is driven by adjuster 211. The temperature of the air space encompassed by the soft magnetic plate 23 and the adiabatic material 24 is controlled so as to be substantially constant by operation of temperature measuring element 201, temperature adjuster 211 and heater 221, which together may be considered as a temperature control means.

According to this embodiment, the output becomes stable with respect to variations in circumferential temperatures, and magnetic shielding is provided by the soft magnetic plate. As a result, there is no possibility that the absorption spectrum will produce Zeeman split on account of outside magnetic fields and that the frequency of the output light be thereby varied, with the waveform being distorted. Moreover, the embodiment prevents influence of earth magnetism from being exerted on absorption cell CL1. Since, with the magnetic field surrounding only the cell CL1, it is unnecessary for the entire wave length stabilizer system to be housed in a magnetic shield case, it is possible to produce a stabilizer system which is small in size.

In the FIG. 24 embodiment, two sheets of soft magnetic plates 23 and a sheet of diabatic material 24 are provided. However, only one sheet of soft magnetic material 23 can be used, or a plurality of soft magnetic plates 23 may be superposed on each other. Thin soft magnetic plates 23 and adiabatic layers 24 can also be laminated alternately in which case the magnetic shielding effect is further enhanced. Also, where the circumferential temperature does not vary much, heater 221 may also be omitted.

Figure 25:
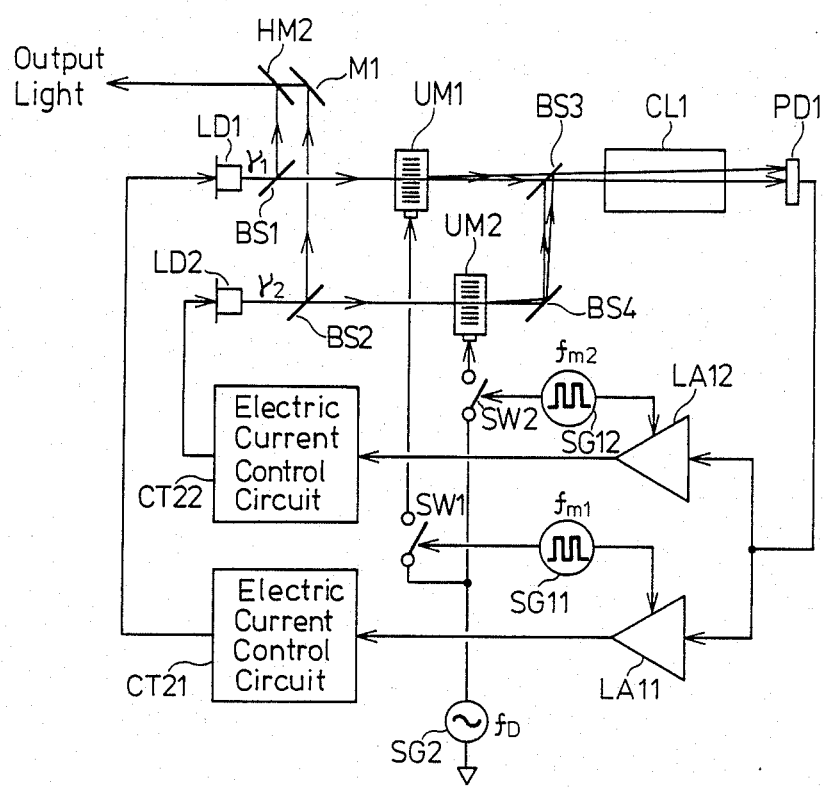
FIG. 25 is a block diagram depicting a sixteenth illustrative embodiment of the invention.

FIG. 25 depicts a sixteenth illustrative embodiment, wherein the output signals from the FIG. 2 embodiment comprises a plurality of wavelengths. In the embodiment, fluxes of output light from semiconductor lasers LD1, LD2 are split by beam splitters BS1, BS2, and a part of the outputs from lasers LD1 and LD2 are arranged to be light outputs. The rest of the thusly split fluxes of light are introduced into acousto-optic deflectors UM1, UM2, respectively. The outputs from deflectors UM1, UM2 are combined by using beam splitters BS3, BS4 and are then introduced into absorption cell CL1. Absorption cell CL1 comprises a substance which absorbs laser beams having multiple wavelengths, for example, cesium (Cs), rubidium (Rb), ammonia ($NH_3$), water ($H_2O$). That is to say, a plurality of absorption spectrums are created in the light which is transmitted through absorption cell CL1. The laser beams which are transmitted through absorption cell CL1 are picked up by light receiving element PD1, and are then converted into electric signals corresponding to the light receiving power. The thus converted electric signals are then inputted to lock in amplifiers LA11, LA12, and then outputted to electric current control circuits CT21, CT22. The outputs of electric current control circuits CT21, CT22 are applied to lasers LD1, LD2. Since the electric current to be applied is prescribed by signals added from the respective electric current control circuits CT21, CT22, the oscillating frequencies of lasers LD1, LD2 are determined by such electric current values.

An oscillator SG2 (frequency $f_D$ is for example 80 MHz) is connected via switches SW1 and SW2 to deflectors UM1, UM2. The outputs (for example, $fm_1 = 2$ kHz, $fm_2 = 2.5$ kHz) of oscillators SG11, SG12 are connected to switches SW1, SW2. Thus, the oscillating wavelength of light applied to deflectors UM1, UM2 is modulated at frequencies $fm_1$, $fm_2$. The outputs of the oscillators SG11, SG12 are also applied to lock in amplifiers LA11, LA12 and are then synchronously rectified at frequencies $fm_1$, $fm_2$. The electric current control circuits CT21, CT22 and lock in amplifiers LA11, LA12 together may be considered a control means.

The operation of the FIG. 25 embodiment is as follows. As an example, cesium (Cs) will be used as the standard substance in the absorption cell CL1. The output light from semiconductor laser LD1 is bidirectionally split through beam splitter BS1. The reflection light becomes the output light to be emitted as the output light of the arrangement. On the other hand, the transmissive light is applied to deflector UM1. As in the case of the arrangement of FIG. 2, the output light from semiconductor laser LD1 having frequency $\nu_1$, undergoes a frequency modulation in deflector UM1 wherein the modulation frequency is $fm_1$ and the modulation depth is $f_D$. Thereafter, the thus modulated output light is applied through beam splitter BS3 to absorption cell CL1. Similarly, the output light from semiconductor laser LD2 having frequency $\nu_2$ is subjected to frequency modulation in acousto-optic deflector UM2 wherein the modulation frequency is $fm_2$, and the modulation depth is $f_D$. Then, the frequency modulation output light is applied through beam splitters BS4 and BS3 to absorption cell CL1.

Figure 26:
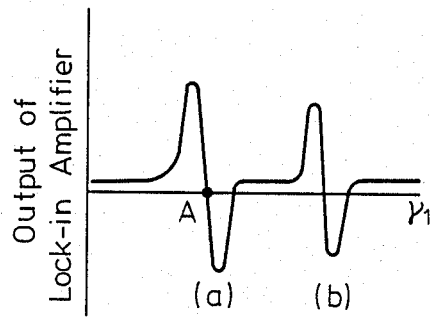
FIG. 26 is a view depicting the output of one of the lock in amplifiers of the embodiment of FIG. 25.
Figure 27:
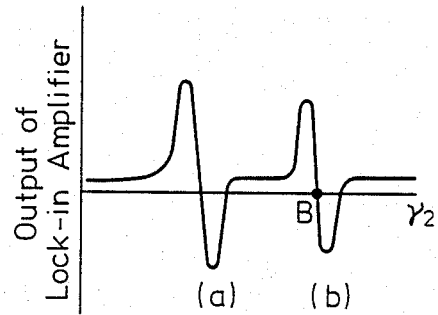
FIG. 27 is a view depicting the output of another lock in amplifier of the embodiment of FIG. 25.

If the light with frequencies $\nu_1$, $\nu_2$ is made to penetrate the Cs atoms existing within absorption cell CL1, with respect to the amount of the transmissive light, there are obtained from cell CL1, and detected by detector PD1, absorption signals, such as depicted in FIG. 4, which correspond to the variations of frequencies $\nu_1$, $\nu_2$. Consequently, the output waveforms generated by lock in amplifiers LA11, LA12 take the shapes depicted in FIGS. 26, 27. These lock in amplifiers LA11 and LA12 differentiate the signals (see FIG. 4) which are transmitted by light receiving element PD1.

Assume that the light having frequency $\nu_1$ is modulated at modulation frequency $fm_1$ and that light wihh frequency $\nu_2$ is likewise modulated at modulation frequency $fm_2$. Then, when lock in amplifiers LA11, LA12 are synchronously rectified at the modulation frequencies $fm_1$, $fm_2$, respectively (at this time, $fm_1$, $fm_2$ are set so that formula $k \cdot fm_1 \neq n \cdot fm_2$ is established, wherein k and n are integers), influence of light having frequency $\nu_2$ is not present in the output from lock in amplifier LA11, and influence of light having frequency $\nu_1$ is not present in the output of lock in amplifier LA12. Subsequently, the output signals from lock in amplifiers LA11, LA12 individually take the waveforms depicted respectively in FIG. 26 (which shows the output of lock in amplifier LA11) and FIG. 27 (which shows the output of lock in amplifier LA12). If the oscillating frequencies of semiconductor lasers LD1, LD2 are controlled by electric current control circuits CT21, CT22, so that the output of lock in amplifier LA11 is at a point A of FIG. 26, and the output of lock in amplifier LA12 is at a point B of FIG. 27, the laser beams generated at the outputs have wavelengths of about 852.112 nm, thereby producing fluxes of light having two wavelengths which differ from each other by 9.2 GHz.

Thus, the semiconductor laser wavelength stabilizer depicted in FIG. 25 which is simple in construction and utilizes an absorption cell, generates laser beams with a plurality of stable wavelengths.

When Rb is used as the absorbent in the cell CL1 instead of Cs, the basic level has an infinitesimal structure wherein $F=1$, $F=2$, similar to the case of Cs. Let the frequency at which absorption is caused from $F=1$ be $\nu_1$, and let the frequency at which the absorption is caused from $F=2$ be $\nu_2$, then $\Delta\nu = \nu_1 - \nu_2$, which is defined as the difference between the two frequencies becomes $\Delta\nu = 6.8$ GHz in time of $87_{Rb}$ and further becomes $\Delta\nu \approx 3$ GHz in time of $85_{Rb}$. When using $D_1$ beams (excitation from a level of $5S_{\frac{1}{2}}$ to a level of $5P_{3/2}$ implies 794.7 nm) of Rb and $D_2$ beams (excitation from a level of $5S_{\frac{1}{2}}$ to a level of $5P_{\frac{3}{2}}$ implies 780.0 nm) of Rb, a formula of $\Delta\lambda = 14.7$ nm is valid. By passing through Cs and Rb, this expression $\Delta\lambda = 852.1 - 780$ (or, $794.7) = 72.1$ (or, $57.4$)nm, is established. Moreover, molecular absorption beams of $H_2O$ and $NH_3$ or the like may be used.

The number of semiconductor lasers used are not limited to the two shown in FIG. 25. If the number of lasers is increased, different types may be used by combining the above-described frequencies. In such a case, the acousto-optic deflector, the lock in amplifier, the oscillator and the electric current control circuit should be proportionally added.

Figure 28:
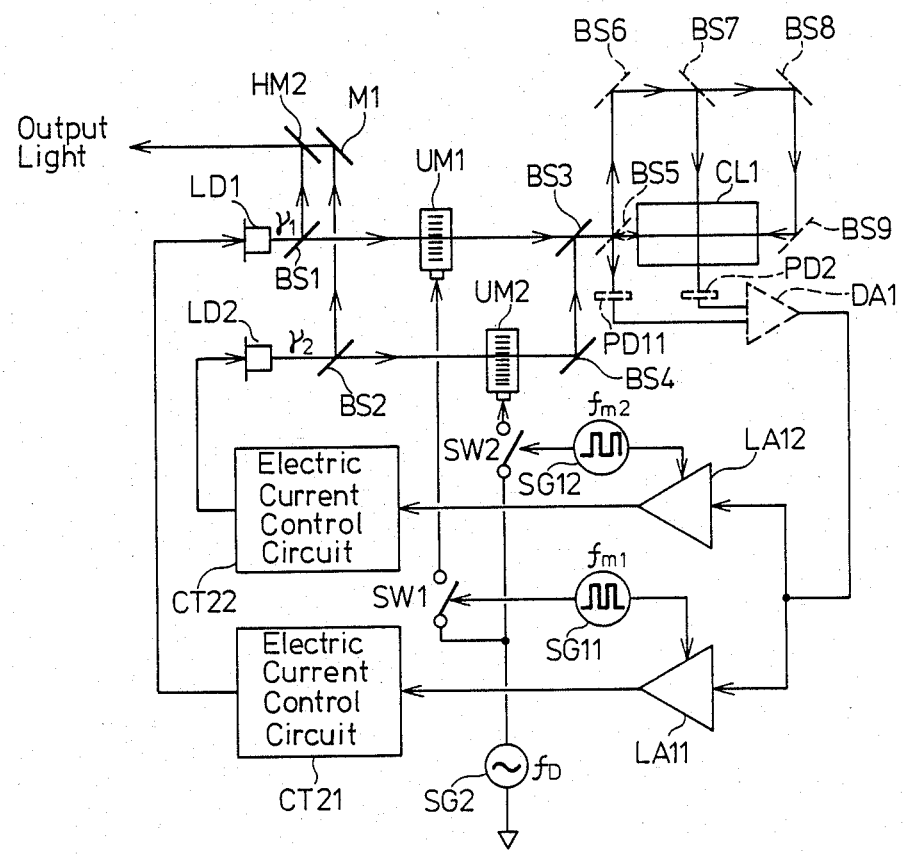
FIG. 28 is a block diagram depicting a seventeenth illustrative embodiment of the invention.

FIG. 28 depicts a seventeenth embodiment. With this embodiment, since the Doppler expansion disappears by virtue of the above mentioned saturated absorption spectroscopy, it is possible to distinguish the infinitesimal structure described in FIG. 3. Consequently, there is obtained an output signal from the lock in amplifier which is based on the infinitesimal structure shown in FIG. 10, so that $\Delta\nu$ can be further reduced, depending on the position at which the signal is locked. The portions indicated on the dotted line in FIG. 28 are different from FIG. 25. In FIG. 28 there are further provided beam splitters BS5 to BS9, light receiving elements PD11, PD2 and differential amplifier DA1. The output signals from amplifier DA1 are introduced into lock in amplifiers LA11 and LA12.

The higher harmonic wave frequency of $fm_1$ or the like can be used as the frequency of a signal to be inputted to the lock in amplifier shown in FIG. 25. In the case, if a triplex harmonic wave is employed, there is yielded an effect wherein bias components of the lock in amplifiers depicted in FIGS. 26, 27 disappear.

Where a polarization beam splitter is used in place of the beam splitter in FIG. 25, the output laser beams become orthogonal polarized waves.

Figure 29:
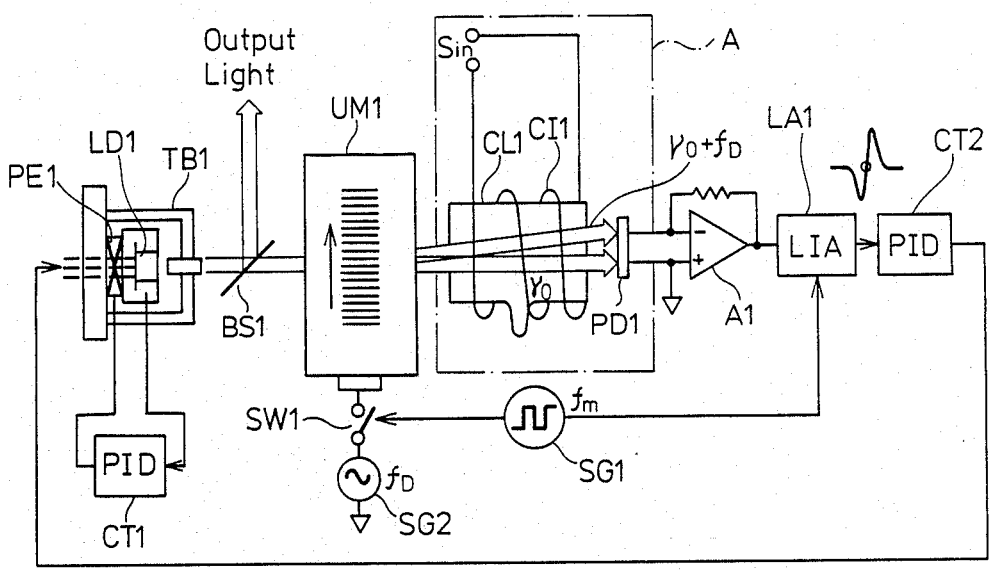
FIG. 29 is a block diagram depicting an eighteenth illustrative embodiment of the invention.

FIG. 29 depicts an eighteenth embodiment wherein the laser output wave length is so varied as to correspond to the input signal. A coil CI1, which is not provided in FIG. 2, is wound about absorption cell CL1 and constitutes a magnetic applying means. This coil CI1 includes terminal ends to which a wavelength variable input signal Sin is applied. Similar to the arrangement of FIG. 2, the output light of the semiconductor laser LD1 is controlled to a stable frequency of $\nu_s - f_D/2$. On applying the wavelength variable input signal Sin to both ends of coil CI1, the electric current flows through coil CI1, thereby generating a magnetic field of a magnitude which corresponds to the signal Sin. By operation of the magnetic field, the absorption spectrum of the standard substance within the cell C11 brings forth Zeeman separation thereby to vary the absorption wavelength. Accompanied with variations of the absorption wavelength, the output wavelength of the semiconductor laser LD1, which is locked to the absorption beam, changes. It is therefore possible to change the wavelength of the laser output light outputted from beam splitter BS1 with the aid of the wavelength variable input signal Sin.

FIG. 29 embodiment produces an outstanding advantage in that the wavelength is rendered variable while keeping a stable state (stable for instantaneous frequency also) in which to lock the semi-conductor laser output light to the absorption signal of the standard substance.

In the FIG. 29 embodiment, the coil CI1 is used as a magnetic field applying means. The invention, however, is not limited to such a coil. For example, the relative position may be varied by locating a permanent magnet close to the absorption cell CL1 or remote therefrom in a manner such as to correspond to input signal Sin.

Figure 30:
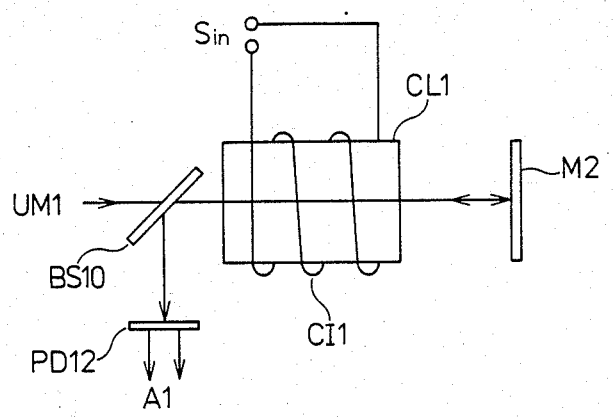
FIG. 30 is a block diagram depicting a nineteenth illustrative embodiment of the invention.

FIG. 30 depicts principal portions of a nineteenth illustrative embodiment wherein a portion A of FIG. 29 is arranged to effect the saturated absorption instead of performing linear absorption. The light which has been modulated by deflector UM1 travels, as pump light, through beam splitter BS10 and upon cell CL1. Light which has penetrated absorption cell CL1 is then reflected on mirror M2 and returned through the previous light path. The returned light serves as a probe light which strikes absorption cell CL1 once again. The transmitted return light is reflected by beam splitter BS10, whereby the saturated absorption signal is detected by detector PD12. Other processes are the same as the arrangement of FIG. 29.

Figure 32:
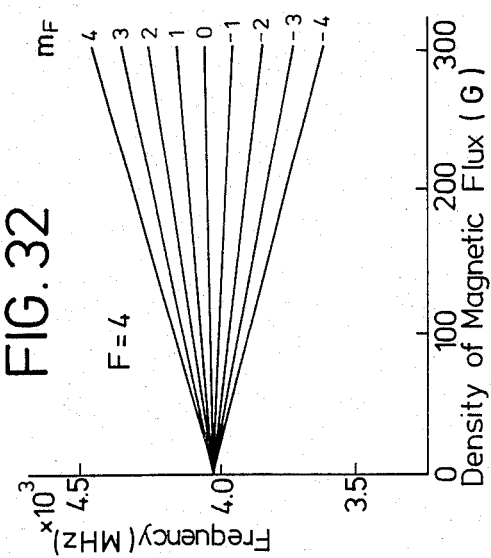
FIGS. 31, 32, and 33 are views each showing an aspect of Zeeman separation of the energy level of the Cs atom.
Figure 33:
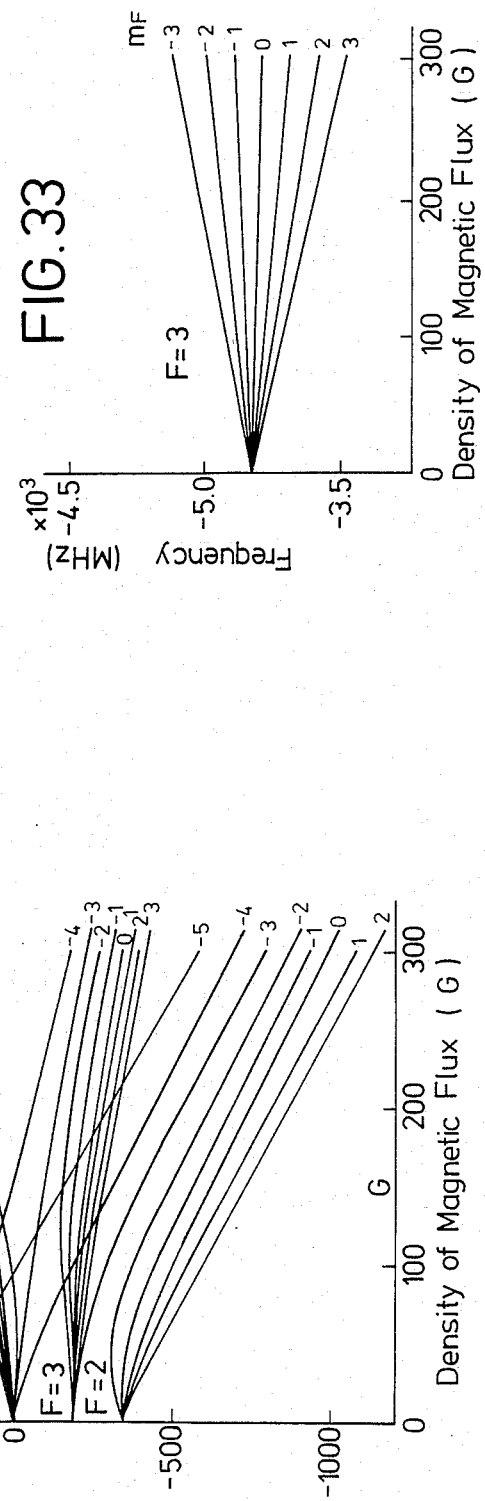
Figure 31:
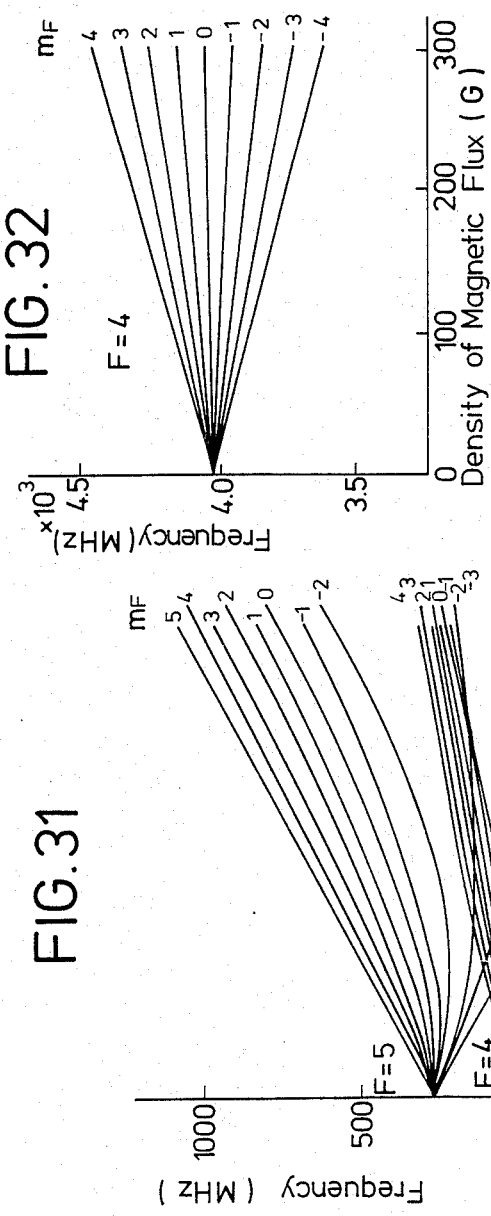

When applying the wavelength variable input signal Sin to both ends of coil CI1, as in the case of the embodiment of FIG. 29, the absorption spectrum of the standard substance in absorption cell CL1 causes Zeeman separation, whereby the saturated absorption wavelength varies. Referring to FIGS. 31, 32, 33 ($m_F$ is the name of an energy level at which Zeeman separation is performed by effecting magnetic modulation), there are shown aspects of Zeeman separation of the respective energy levels of Cs. FIG. 31 is a diagram showing the characteristic curve of the Zeeman separation of a $6^2P_{3/2}$ excitation level of Cs. FIG. 32 is a diagram showing a characteristic curve of the Zeeman separation of a level of an infinitesimal structure of F=4 in which the basic state of Cs is $6^2S_{\frac{1}{2}}$. FIG. 33 is a diagram showing the characteristic curve of the Zeeman separation of a level of an infinitesimal structure of F=3 in which the basic stat of Cs is $6^2S_{\frac{1}{2}}$. For example, if the frequency of the semiconductor laser LD1 is controlled to the absorption spectrum obtained when shifting from F=3 of $6^2S_{\frac{1}{2}}$ to F=2 of $6^2P_{3/2}$, the absorption spectrum shifts toward lower frequencies at the time of applying the magnetic field to the absorption cell CL1. As a result, the oscillating frequency of the laser LD1 concurrently shifts toward the lower ones.

According to the thus described embodiment of FIG. 30, excepting the characeristics inherent to the arrangement of FIG. 29, there is an additional characteristic wherein variations in saturated absorption frequency are large with respect to changes in magnitude of the magnetic field and hence the sensitivity increases. Since the width of the absorption spectrum is large in the embodiment of FIG. 29, as compared to that of FIG. 30, the output frequency can be controlled to only the mean value of the energy levels (e.g. F=5 to 5 of FIG. 31) of the infinitesimal structure. Consequently, the sensitivity becomes smaller than this.

Figure 34:
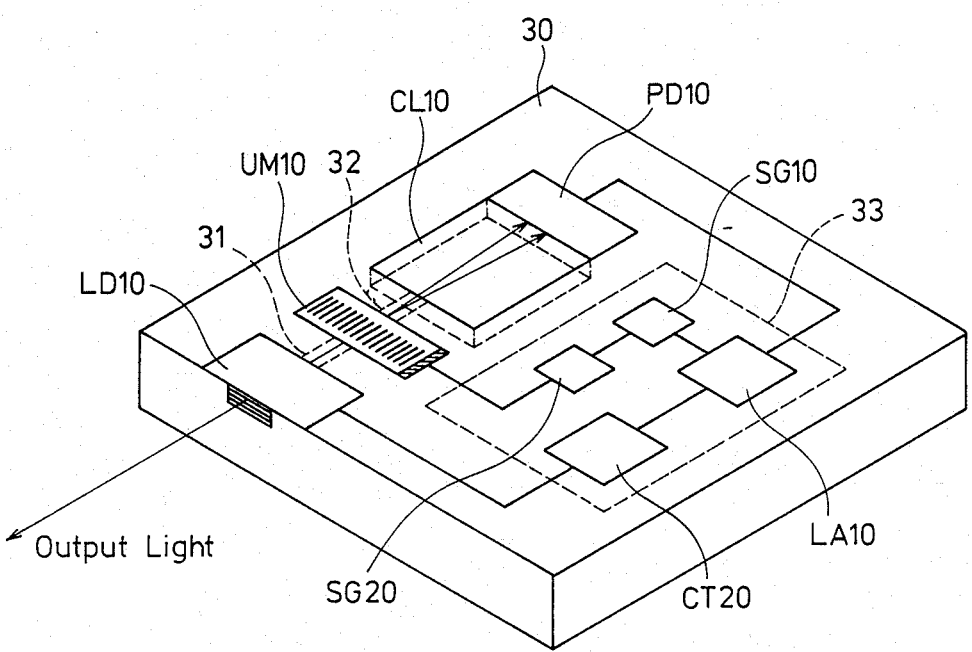
FIG. 34 is a perspective view depicting a twentieth illustrative embodiment of the invention.

FIG. 34 depicts a twentieth illusrative embodiment wherein the circuits are combined in an integrated structure (called IC formation). The arrangement comprises a photo integrated circuit (photo -IC) substrate 30 comprising, for example, GaAs or the like. The different components which are to be formed on the substrate 30 are a semiconductor laser LD10, a light waveguide path 31 upon which the output light of the semiconductor laser falls, an acousto-optic deflector UM10 (ultrasonic deflecting member) upon which the light emerging from waveguide path 31 falls, another light wave guide path 32 which is subjected to incidence of output light from acousto-optic deflector UM10, an absorption member CL10 which encloses a standard substance (e.g. Cs) capable of absorbing light with a specified wavelength applied from light waveguide path 32, and a light receiving member PD10 upon which the emergent light from absorption member CL10 falls. Also provided on substrate 30 are a control member 33 for inputting output electric signals from light receiving member PD10. Control member 33 comprises a lock in amplifier circuit LA10, the input of which is connected to the output of light receiving member PD10, an electric current control circuit CT20 comprising a PID controller circuit which includes its input connected to the output of the lock in amplifier circuit LA10 and its output connected to an injection electric current input of laser LD10, a signal generating circuit SG10 (e.g. an oscillating circuit) with a frequency fm (e.g. 2 kHz) and a second signal generating circuit SG20 (e.g. an oscillating circuit) with a frequency FD (e.g. 80 MHz). One of the outputs of signal generating circuit SG10 serves as a reference signal which is inputted to lock in amplifier circuit LA10. The output of second signal generating circuit SG20 is connected to the deflector UM10 and is modulated by the output signals from signal generating circuit SG10.

The operation of the embodiment of FIG. 34 is the same as the arrangement of FIG. 2. The device of FIG.34 is integrated onto one chip and hence is small in size, is capable of being mass produced and is easy to adjust and maintain.

FIG. 35 is a table showing a method of fabricating the device of FIG. 34. For example, the electric current circuit is of a monolithic construction using a silicon substrate. In other cases, however, the components may be of a hybrid construction. Various construction details will be set forth below.

Figure 36:
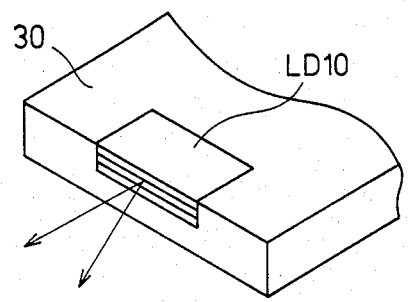
FIGS. 36 and 37 are perspective views each depicting principal portions of an example of the embodiment of FIG. 34.

FIG. 36 is a perspective view showing the principal portions of a semiconductor laser LD10 fabricated on a photo IC substrate 30 using monolithic construction.

Figure 37:
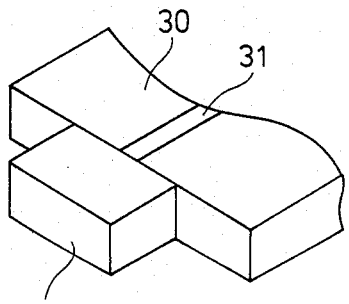
Figure 38:
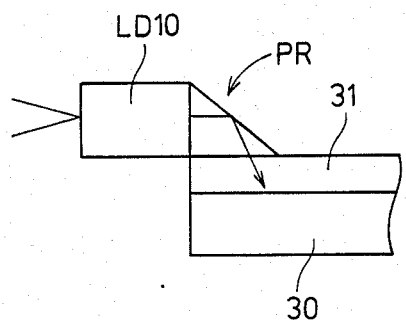
FIGS. 38, 39 and 40 are sectional views each depicting principal portions of the embodiment of FIG. 34.

FIG. 37 is a perspective view showing the principal portions of the device using a hybrid construction. FIG. 38 is a section view of another example. In FIG.37, the end surface of waveguide path 31, formed on the photo IC substrate 30, is directly irradiated with the outputs of semiconductor laser LD10. In FIG. 38, the output light of semiconductor laser LD10 is arranged to be introduced via a prism PR into waveguide path 31.

Figure 39:
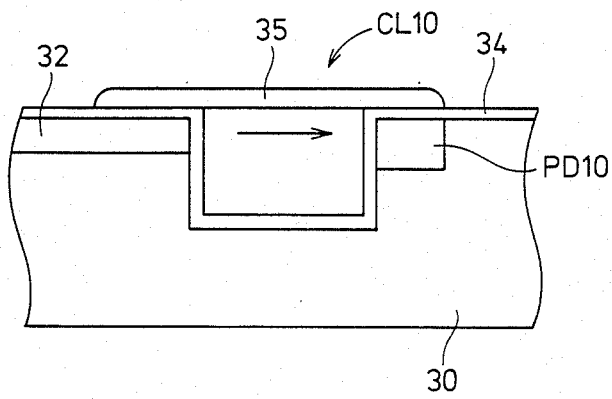

FIG. 39 is a sectional view of the device of FIG. 34 wherein a recessed portion (unnumbered, has arrow shown therein) is formed by etching or other similar method in the surface of photo IC substrate 30. A glass film 34 is formed thereon by glass coating or thermal oxidation. A standard substance, such as Cs, is placed into the recessed portion. This recessed portion is covered with a glass plate 35, e.g. by fusion bonding, thus enclosing the standard substance within absorption member CL10. Wave guide path 32 and detector PD10 are also depicted.

Figure 40:
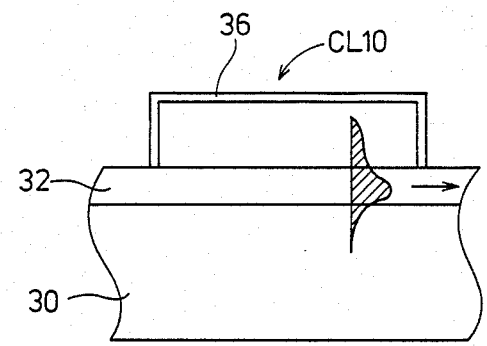

FIG. 40 is a sectional view showing another example of absorption member CL10 relative to the device depicted in FIG. 34. In FIG. 40, a waveguide path 32 is formed on substrate 30 which comprises, e.g. GaAs, LiNbO$_3$, or the like. By evanescent effect, the standard substance enclosed by cover 36, provided on waveguide path 32, absorbs output light passing through waveguide path 32 from semiconductor laser (e.g. LD10 of FIG. 34). In this example, there is an advantage in that the manufacturing is easier than that for forming the device of FIG. 39.

It is to be noted that the photo-detecting member can be integrated into the monolithic structure or the hybrid structure in each of the above embodiments.

Figure 41:
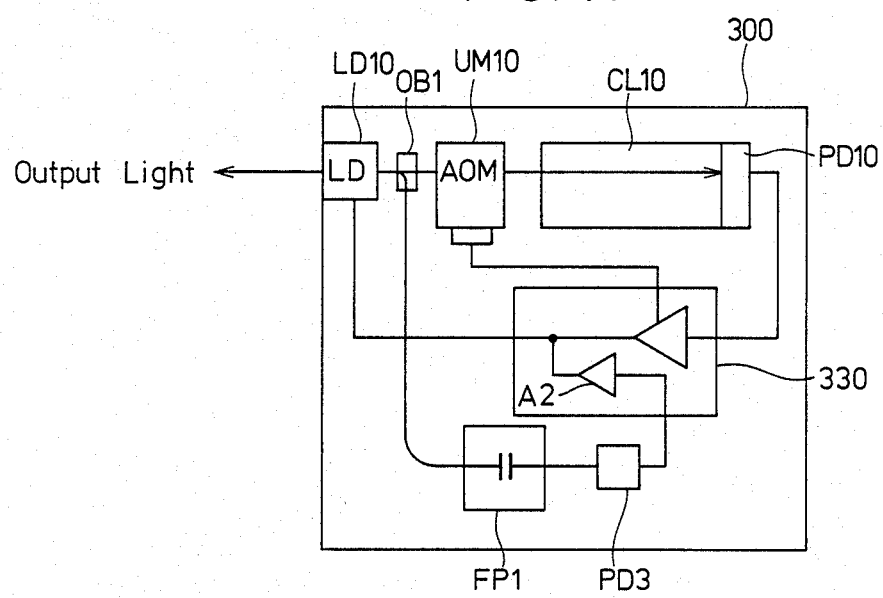
FIG. 41 is a plan view depicting the embodiment of FIG. 34 having further components to produce still narrower spectrums.

FIG. 41 depicts a twenty first embodiment wherein the spectrum relative to the arrangement of FIG. 34 is rendered narrower. Onto photo IC substrate 300 are additionally provided a light branching member OB1 for branching off a part of the fluxes of the output light from semiconductor laser LD10, a light resonant member FP1 consisting of a Fabry-Pero etalon which is supplied light branched off by means of the light branching member OB1, a second photo detecting member PD3 upon which the output light from light resonant member FP1 strikes, and a broad band region amplifying member A2 for amplifying the electric output signal from photo detecting member PD3 and for feeding the thus amplified outputs back to an injection electric current of laser LD10. In this configuration, the broad band amplifying member A2 (this is roughly illustrated for simplicity in FIG. 41) is provided in control member 330. A resonant curve (a position which deviates from the central frequency) of the light resonant member FP1 is made to accord with an oscillating wavelength of the semiconductor laser LD10. Phase noises contained in the output light of semiconductor laser LD10 are detected by photo detector PD3 after converting them into amplitude moducation signals, and the electric outputs thereof are negatively fed via the broad band region amplifier A2, having a band region which is wider than the width of the spectrum of the semiconductor laser beam, back to the driving electric current (injection electric current) of semiconductor laser LD10, thereby restraining the phase noises of the laser LD10 and so as to make the spectrum still narrower. (For reference, see M. Ohtsu and S. Kotajima, IEEE Journal of Quantum Electronics, Vol. QE-21, No. 12, December 1985)

Figure 42A:
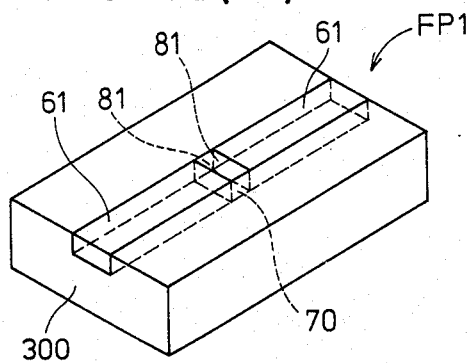
FIGS. 42(A), 42(B), 42(C) and 43 are view each depicting principal portions of another example of the embodiment of FIG. 34.
Figure 42B:
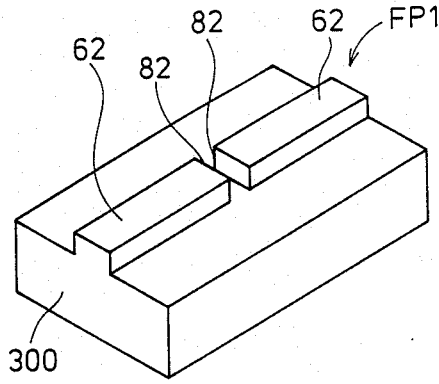
Figure 42C:
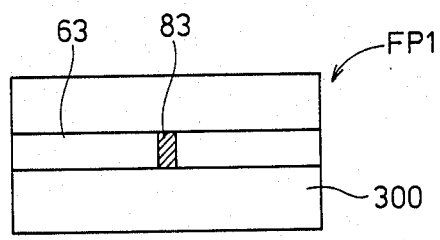

FIGS. 42(A), 42(B) are perspective view each showing principal portions of the Fabry-Petrot resonator FP1 provided on a photo IC substrate 300 in the arrangement of FIG. 41. FIG. 42(C) is a plan view showing the same principal portions. In FIG. 42(A), a hole 70 is formed in a part of a waveguide path 61 provided on substrate 300, and two surfaces 81 which partially constitute the hole 70 and are disposed vis-a-vis with each other are coated with reflection films, thus forming a resonator. In FIG. 42(B), two ridges 62 serving as waveguide paths are so spaced from each other as to be placed in series on the substrate 300, and end surfaces 82 of these ridges 62, which surfaces stand vis-a-vis with each other, are formed with reflection films, thus constituting the resonator. In FIG. 42(C), a material having a high refractive index is doped to a part of waveguide path 63 provided on the substrate 300, thus forming a resonant member 83.

Figure 43:
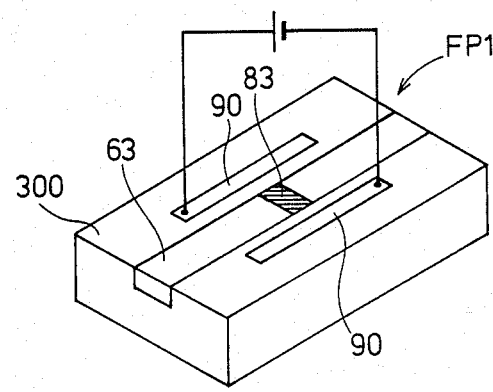

FIG. 43 is a perspective view showing principal portions of a means for adjusting the resonant frequency of the light resonant member FP1 in the arrangement of FIG. 42(C). In FIG. 43, electrodes 90 are provided on both sides of resonant member 83 and disposed on substrate 300. The effective length of resonant member 83 is varied by changing the refractive index of the resonant member 83 with the aid of electric current that is applied between electrodes 90. As another means for adjusting the resonant frequency, there is a method wherein a thin film resistance for a heater is formed in close proximity to the light resonant member provided on the substrate, and the length of the resonator is varied by controlling thermal expansion. In addition, a ferroelectric substance which has high refractive index may be doped and the refractive index thereof varied by controlling the electric field applied in the device of FIG. 43.

In the case of controlling the temperature of the semiconductor laser LD10 and the light resonant member FP1 to a preset value, the thin film resistances are respectively used for heaters. In this case, it is desirable that the heaters be disposed as remote as possible so that they do not interfere with each other.

In the respective embodiments of FIGS. 34 through 43, the linear absorption method is utilized for stabilizing the laser wavelengths. It is also feasible to form devices which utilize the saturated absorption method to stabilize the laser wavelength, by using IC forming techniques.

Figure 44:
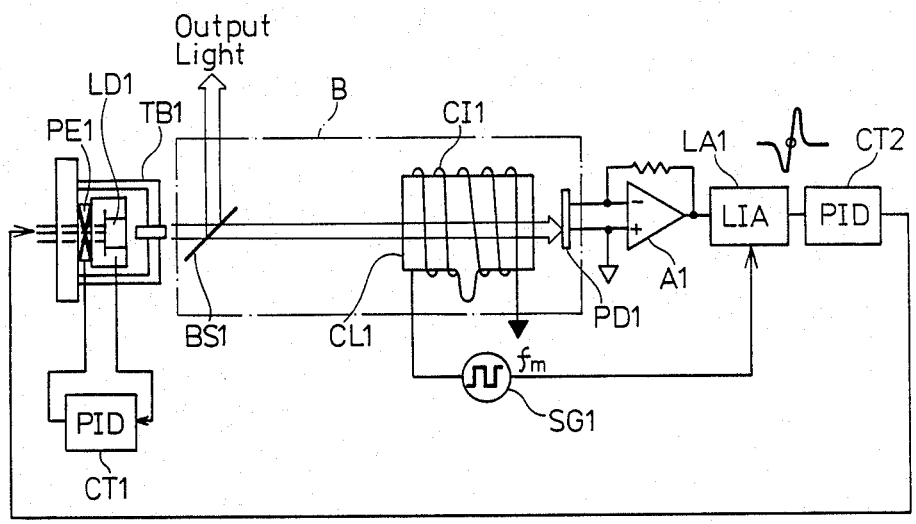
FIG. 44 is a block diagram depicting a twenty second illustrative embodiment of the invention.

FIG. 44 depicts a twenty second embodiment wherein the absorption wavelength of the standard substance is modulated by a magnetic field. The differences between this embodiment and that of FIG. 2 are as follows. A coil CI1 is wound on absorption cell CL1 and constitutes a magnetic field applying means. The output of transmissive light through beam splitter BS1 falls upon the absorption cell CL1. The output signals from signal generator SG1 provide electric current which is modulates the above coil CI1 at a frequency fm (e.g. 2 kHz). The output signals from SG1 serve as reference signals for lock in amplifier LA1.

Figure 45:
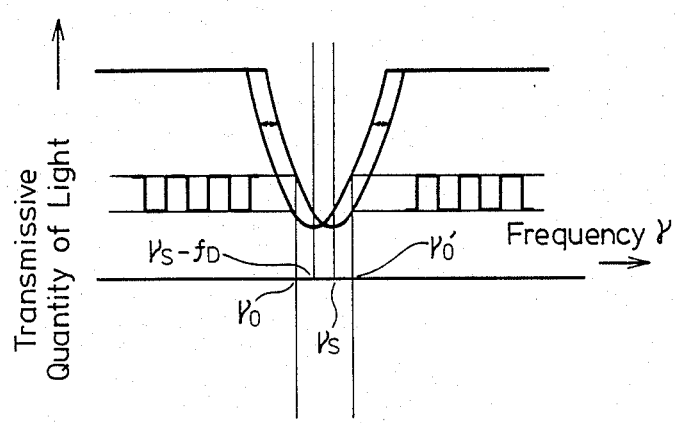
FIG. 45 is an explanatory view depicting operation of the embodiment of FIG. 44.

On applying the output signals from signal generator SG1 to both ends of coil CI1, an electric current which modulates coil CI1, beings to flow, thereby generating a magnetic field in which the intensity varies at frequency fm. Corresponding to the variations in this magnetic field, the absorption wave length of the standard substance within the absorption cell CL1 is changed by Zeeman separation. As a result, the laser beams fall upon the absorption cell CL1, signals are present in the output when the amount of transmissive light is, as shown in FIG. 45, modulated only at the position of the absorption signal. It is herein presumed that the magnetic field is modulated within a scope of 0 to a certain value at the frequency fm. $\nu_s$ is the absorption frequency when the output electric current is 0 and whent he magnetic field is 0. $f_D$ is the degree to which the absorption frequency varies in time of the magnetic field being applied. This signal is converted into an electric signal by means of photo detector PD1 and is then synchronously rectified at the frequency fm in lock in amplifier LA1 through the intermediary of amplifier A1, thereby producing a primary differential waveform illustrated in the characteristic curve of FIG. 6. As in the case of the embodiment of FIG. 2, if the output of lock in amplifier LA1 is locked (i.e. controlled) to the center of the primary differential waveform, the output of the laser has a stable frequency of $\nu_s - f_D/2$.

According to the stabilizer of FIG. 44, no acousto-optic deflector is used. It is therefore possible to obtain non-modulation outputs which exibit characteristics of high stability for instantaneousness in a compact arrangement which can be produced at low cost. Since an acousto-optic deflector is not used, the embodiment enjoys such advantages as, a small amount of heat is evolved, and the power consumption is reduced.

Furthermore, it is practicable to effect saturated absorption instead of linear absorption by using the device of FIG. 30 in the portion labeled B in FIG. 44. In such a device saturated absorption spectrum can be varied even in a weal modulation magnetic field since changes in saturated absorption frequency with respect to the variations in magnitude of the magnetic field are large (i.e. the sensitivity to the variations of magnetic field is high).

According to the invention, it is feasible to produce a semiconductor laser which has a highly stable instantaneous oscillating frequency using only a simple arrangement.

The foregoing description is illustrative of the principles of the invention. Numerous modifications and extensions thereof would be apparent to the worker skilled in the art. All such modifications and extensions are to be considered to be within the spirit and scope of the invention.

What is claimed is:

1. A semiconductor laser wavelength stabilizer for stabilizing the wavelength of a semiconductor laser by controlling the wavelength to an absorption spectrum line of a standard substance, said stabilizer comprising an acousto-optic modulator for frequency modulating a part of output light of the semiconductor laser incident thereon;

an absorption cell comprising said standard substance sealed therein and capable of absorbing at a specific wavelength a primary diffracting light and a zero dimensional diffracting light outputted from said acousto-optic modulator;

a photo detector for converting into electrical signals said primary and zero dimensional diffracting lights passed through said absorption cell;

synchronously rectifying means for synchronously rectifying electrical signals associated with the electrical signals outputted from said photo detector at a first frequency or at an odd multiple thereof; and control means for controlling the oscillating wavelength of said semiconductor laser based on electrical signals outputted from said synchronously rectifying means so that output signals of said synchronously rectifying means become a specified value;

whereby said acousto-optic modulator is driven by a modulated signal obtained as a result of frequency modulating a second frequency signal with said first frequency signal.

2. The stabilizer of claim 1, wherein said standard substance is selected from the group consisting of Cs and Rb.

3. The stabilizer of claim 2, wherein further comprising reflection means for reflecting light transmitted from said absorption cell back to said absorption cell.

4. The stabilizer of claim 1, wherein at least a part of said absorption cell comprises a vessel made of a transmissive material and having a first surface upon which light is rendered incident and a second surface from which said light emerges, said first and second surfaces being inclined at predetermined angles to a plane orthogonal to a central axis of said vessel.

5. The stabilizer of claim 1, comprising an optical fiber disposed through said standard substance contained within said absorption cell with evanescent portions of light travelling through said optical fiber interacting with said standard substance.

6. The stabilizer of claim 1, wherein said absorption cell is provided inside a constant temperature oven having a path for the output light of said acousto-optic modulator; and comprising temperature control means for controlling the temperature of said absorption cell to a preset value.

7. The stabilizer of claim 1, wherein said absorption cell is coated with at least one sheet of magnetic material layer and one sheet of adiabatic layer.

8. The stabilizer of claim 1, comprising means for applying to said absorption cell a magnetic field having a magnitude corresponding to an input signal, and wherein a laser beam whose wavelength varies in accordance with said input signal is outputted by said absorption cell.

9. The stabilizer of claim 1, wherein said synchronously rectifying means comprises a lock in amplifier, and said control means constrols an electrical current supplied to said semiconductor laser or controls the temperature of said semiconductor laser so that output signals of said lock in amplifier become a specified value.

10. The stabilizer of claim 1, comprising a variable gain amplifier for amplifying the electrical signals outputted from said photo detector and for outputting signals to said synchronously rectifying means with the gain of said variable gain amplifier being controlled by signals associated with the output signals of said photo detector.

11. A semiconductor laser wavelength stabilizer for stabilizing the wavelengths of fluxes of output light from a plurality of semiconductor lasers by controlling the wavelengths to absorption spectrum beams of a standard substance, said stabilizer comprising a plurality of acousto-optic modulation means for effecting modulations at different modulation frequencies on fluxes of output light from said plurality of semiconductor lasers;

an absorption cell comprising said standard substance for effecting absorption at a plurality of specified wavelengths on a plurality of primary diffracting light and zero dimensional diffracting light outputted from saidi plurality of acousto-optic modulation means;

a photo detector for converting into electric signals said plurality of primary and zero dimensional diffracting lights passed through said absorption cell;

synchronously rectifying means for synchronously rectifying electrical signals associated with the electrical signals outputted from said photo detector at a first frequency or at an odd multiple thereof; and control means for controlling the oscillating wavelength of said semiconductor lasers based on electrical signals outputted from said synchronously rectifying means so that output signals of said synchronously rectifying means become a specified value;

whereby said acousto-optic modulator is driven by a modulated signal obtained as a result of frequency modulating a second frequency signal with said first frequency signal.

12. A semiconductor laser wavelength stabilizer for stabilizing the wavelength of a semiconductor laser by controlling the wavelength to an absorption spectrum beam of a standard substance, said stabilizer comprising a substrate, and disposed on said substrate an acousto-optic modulator for frequency modulating a part of the output light from said semiconductor laser incident thereon;

an absorption member comprising said standard substance for causing absorption at a specified wavelength, said absorption member acting on output light from said acousto-optic modulator transmitted via a waveguide path;

a photo detecting member for converting transmitted light from said absorption member into electrical signals;

synchronously rectifying means for synchronously rectifying electrical signals associated with the electrical signals outputted from said photo detecting member at a first frequency or at an odd multiple thereof; and control means for controlling the oscillating wavelength of saidi semiconductor laser based on electrical signals outputted from said synchronously rectifying means so that output signals of said synchronously rectifying means become a specified value;

whereby said acousto-optic modulator is driven by a modulated signal obtained as a result of frequency modulating a second frequency signal with said first frequency signal.

13. The stabilizer of claim 12, wherein said absorption member is formed with a glass film deposited on a recessed portion formed in the surface of said substrae by glass coating or by oxidation, and a glass plate covering said recessed portion to enclose said standard substance.

14. The stabilizer of claim 12, wherein said absorption member comprises a waveguide path provided on a glass substrate, and a covering enclosing said standard substance provided on said waveguide path, and light based on output light from said semiconductor laser is absorbed by said standard substance disposed on said waveguide path.

15. The stabilizer of claim 12, wherein said synchronously rectifying means comprises a lock in amplifier.

16. The stabilizer of claim 12, wherein the following components are disposed on said substrate: a light branching member for branching of the output light from said semiconductor laser with one branched output light being outputted to said acousto-optic modulator ; a light resonant member for undergoing incidence of the other branched output light from said light branching member; a second photo detector member for undergoing incidence of the output light of said light resonant member; and a broad band region amplifying member for amplifying the electric output from said second photo detector member and feeding the electric output back to said semiconductor laser as its injection electric current.

17. A semiconductor laser wavelength stabilizer for stabilizing a wavelength of an output light from a semiconductor laser by controlling the wavelength to an absorption spectrum line of a standard substance, said stabilizer comprising an absorption cell comprising said standard substance for causing absorption at a specified wavelength and for undergoing light relative to output light of said laser;

magnetic applying means for applying a magnetic field to said absorption cell;

a signal generator for varying the intensity of said magnetic applying means at a fixed frequency;

a photo detector for converting transmitted light from said absorption cell into electric signals;

synchronously rectifying means for synchronously rectifying electrical signals associated witih the electrical signals outputted from said photo detector at said fixed frequency or at an odd multiple thereof; and control means for controlling an electric current supplied to said semiconductor laser, based on electrical signals outputted from said synchronously rectifying means.

* * * * *